United States Patent
Hu et al.

(10) Patent No.: US 11,538,655 B2
(45) Date of Patent: *Dec. 27, 2022

(54) MULTI-BEAM INSPECTION APPARATUS

(71) Applicant: ASML Netherlands B.V., Veldhoven (NL)

(72) Inventors: Xuerang Hu, San Jose, CA (US); Xuedong Liu, San Jose, CA (US); Zhong-wei Chen, San Jose, CA (US); Weiming Ren, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 130 days.

This patent is subject to a terminal disclaimer.

(21) Appl. No.: 17/135,915

(22) Filed: Dec. 28, 2020

(65) Prior Publication Data
US 2021/0151280 A1 May 20, 2021

Related U.S. Application Data

(63) Continuation of application No. 16/401,065, filed on May 1, 2019, now Pat. No. 10,879,032.

(60) Provisional application No. 62/665,451, filed on May 1, 2018.

(51) Int. Cl.
*H01J 37/14* (2006.01)
*H01J 37/15* (2006.01)
(Continued)

(52) U.S. Cl.
CPC .......... *H01J 37/153* (2013.01); *H01J 37/14* (2013.01); *H01J 37/1472* (2013.01); *H01J 2237/1532* (2013.01); *H01J 2237/1534* (2013.01)

(58) Field of Classification Search
CPC ...... H01J 37/153; H01J 37/14; H01J 37/1472; H01J 2237/1532; H01J 2237/1534
See application file for complete search history.

(56) References Cited

U.S. PATENT DOCUMENTS 3,717,785 A 2/1973 Guernet
7,569,833 B2 8/2009 Kruit
(Continued)

FOREIGN PATENT DOCUMENTS

CN 1759465 A 4/2006
JP 2008066359 A 3/2008
(Continued)

OTHER PUBLICATIONS

Office Action issued by the ROC (Taiwan) Patent Office in related Application No. 108113718, dated Apr. 30, 2020 (10 pgs.).
(Continued)

*Primary Examiner* — Sean M Luck
(74) *Attorney, Agent, or Firm* — Finnegan, Henderson, Farabow, Garrett & Dunner, LLP

(57) ABSTRACT

An improved source conversion unit of a charged particle beam apparatus is disclosed. The source conversion unit comprises a first micro-structure array including a plurality of micro-structures. The plurality of micro-structures is grouped into one or more groups. Corresponding electrodes of micro-structures in one group are electrically connected and driven by a driver to influence a corresponding group of beamlets. The micro-structures in one group may be single-pole structures or multi-pole structures. The micro-structures in one group have same or substantially same radial shifts from an optical axis of the apparatus. The micro-structures in one group have same or substantially same orientation angles with respect to their radial shift directions.

18 Claims, 18 Drawing Sheets

(51) Int. Cl.
H01J 37/153 (2006.01)
H01J 37/147 (2006.01)

(56) References Cited

U.S. PATENT DOCUMENTS

| | | |
|---|---|---|
| 8,987,677 B2 | 3/2015 | Wieland et al. |
| 2006/0138359 A1 | 6/2006 | Maeda |
| 2006/0289804 A1 | 12/2006 | Knippelmeyer et al. |
| 2009/0026389 A1 | 1/2009 | Platzgummer |
| 2010/0270474 A1 | 10/2010 | Platzgummer et al. |
| 2011/0068276 A1 | 3/2011 | Kruit et al. |
| 2016/0284505 A1 | 9/2016 | Ren et al. |

FOREIGN PATENT DOCUMENTS

| | | |
|---|---|---|
| JP | 2011-517130 | 5/2011 |
| JP | 2013-508991 | 3/2013 |
| JP | 2018-032791 | 3/2018 |
| KR | 2012-0088780 A | 8/2012 |
| TW | 201833968 | 9/2018 |

OTHER PUBLICATIONS

International Search Report issued in related International Application No. PCT/EP2019/059206, dated Aug. 9, 2019 (3 pgs.).
Notice of Reasons for Rejection issued in related Japanese Patent Application No. 2020-555034; dated Sep. 14, 2021 (4 pgs.).
Notification of Reason(s) for Refusal issued in related Korean Patent Application No. 10-2020-7031464; dated Jul. 23, 2022 (6 pgs.).

900

910 — Instruct a first driver, connected to a first group of micro-structures in a first micro-structure array, to control a first set of one or more voltages to influence a first group of corresponding one or more beamlets 920 — Instruct a second driver, connected to a second group of micro-structures in the first micro-structure array, to control a second set of one or more voltages to influence a second group of corresponding one or more beamlets 930 — Instruct a third driver, connected to a first group of micro-structures in a second micro-structure array, to control a third set of one or more voltages to influence the first group of corresponding one or more beamlets 940 — Instruct a fourth driver, connected to a second group of micro-structures in the second micro-structure array, to control a fourth set of one or more voltages to influence the second group of corresponding one or more beamlets

FIG. 9

MULTI-BEAM INSPECTION APPARATUS

CROSS-REFERENCE TO RELATED APPLICATIONS

This application is a continuation of U.S. application Ser. No. 16/401,065, filed May 1, 2019, which claims priority of U.S. application 62/665,451, which was filed on May 1, 2018. The disclosures of the above-referenced applications are incorporated herein by reference in their entireties.

TECHNICAL FIELD

The embodiments provided herein disclose a multi-beam inspection apparatus, and more particularly, a multi-beam inspection apparatus including an improved source conversion unit.

BACKGROUND

When manufacturing semiconductor integrated circuit (IC) chips, pattern defects and/or uninvited particles (residuals) inevitably appear on a wafer and/or a mask during fabrication processes, thereby reducing the yield to a great degree. For example, uninvited particles may be troublesome for patterns with smaller critical feature dimensions, which have been adopted to meet the more and more advanced performance requirements of IC chips.

Pattern inspection tools with a single electron beam have been used to detect the defects and/or uninvited particles. These tools typically employ a scanning electron microscope (SEM). In the SEM, a beam of primary electrons having a relatively high energy is decelerated to land on a sample at a relatively low landing energy and is focused to form a probe spot thereon. Due to this focused probe spot of primary electrons, secondary electrons will be generated from the surface. By scanning the probe spot over the sample surface and collecting the secondary electrons, pattern inspection tools may obtain an image of the sample surface.

SUMMARY

The embodiments of the present disclosure provide a multi-beam inspection apparatus, and more particularly, a multi-beam inspection apparatus including an improved source conversion unit. In some embodiments, a micro-structure array including a first group of single-pole structure is provided. The first group of single-pole structures has first radial shifts from a central axis of the array, wherein the first radial shifts are equal or substantially equal. Furthermore, the first group of single-pole structures includes corresponding electrodes that are electrically connected and driven by a first driver.

In some embodiments, a micro-structure array including a first group of multi-pole structures is provided. The first group of multi-pole structures has first radial shifts from a central axis of the array and first orientation angles, wherein the first radial shifts are equal or substantially equal, and the first orientation angles are equal or substantially equal. Furthermore, the first group of multi-pole structures includes corresponding electrodes that are electrically connected and driven by a first driver.

In some embodiments, a source-conversion unit in a charged particle apparatus is provided. The source-conversion unit includes a first micro-structure array having a first group of multi-pole structures. The first group of multi-pole structures has first radial shifts from an optical axis of the apparatus and first orientation angles, wherein the first radial shifts are equal or substantially equal, the first orientation angles are same or substantially same. Furthermore, the first group of multi-pole structures includes corresponding electrodes that are electrically connected and driven by a first driver associated with the first micro-structure array.

BRIEF DESCRIPTION OF FIGURES

The above and other aspects of the present disclosure will become more apparent from the description of exemplary embodiments, taken in conjunction with the accompanying drawings.

FIG. 9 is a flow chart illustrating an exemplary method for controlling drivers associated with micro-structures, consistent with embodiments of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Relative dimensions of components in drawings may be exaggerated for clarity. Within the following description of drawings, the same or like reference numbers refer to the same or like components or entities, and only the differences with respect to the individual embodiments are described.

Without limiting the scope of the protection, all the description and drawings of the embodiments will exemplarily be referred to as an electron beam. However, the embodiments are not used to limit the present invention to specific charged particles.

Figure 1:
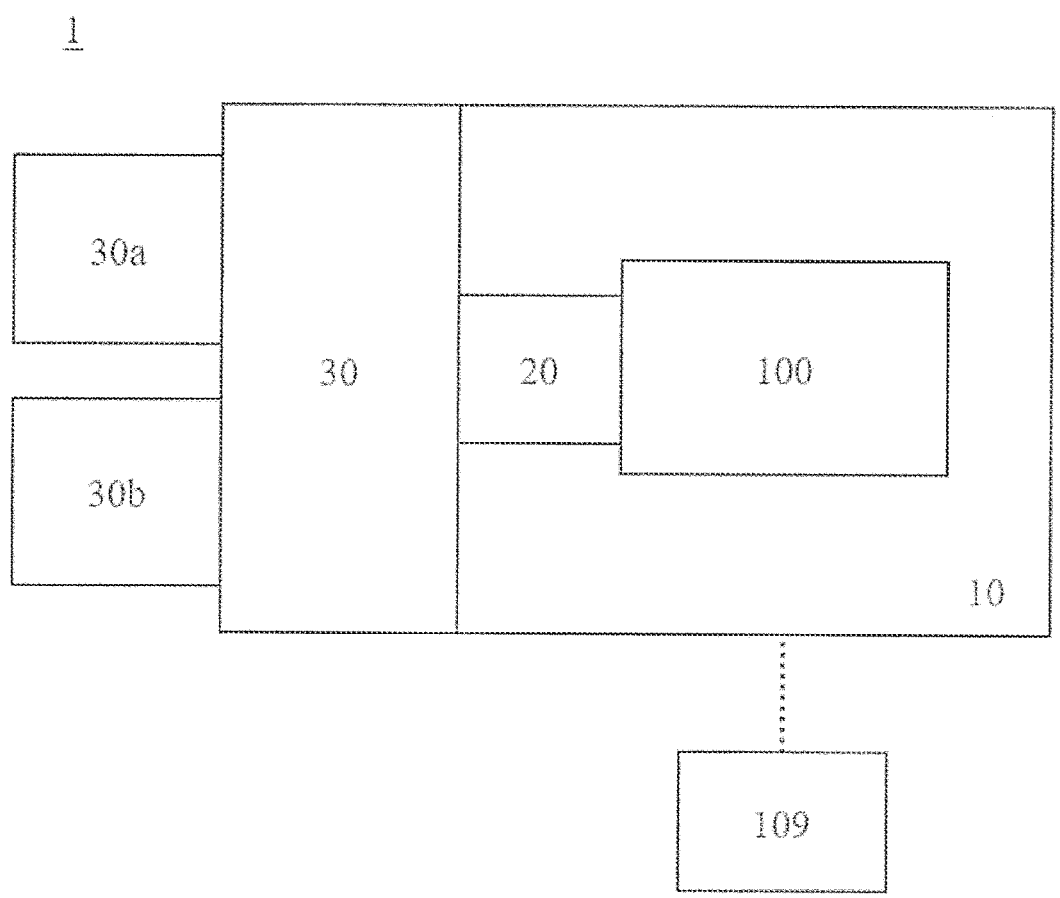
FIG. 1 is a schematic diagram illustrating an exemplary electron beam inspection (EBI) system, consistent with embodiments of the present disclosure.

Reference is now made to FIG. 1, which is a schematic diagram illustrating an exemplary electron beam inspection (EBI) system, consistent with embodiments of the present disclosure. As shown in FIG. 1, charged particle beam inspection system 1 includes a main chamber 10, a load/lock chamber 20, an electron beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load/lock chamber 20.

Load/lock chamber 20 is connected to a load/lock vacuum pump system (not shown), which removes gas molecules in load/lock chamber 20 to reach a first pressure below the atmospheric pressure. After reaching the first pressure, one or more tobot arms (not shown) transport the wafer from load/lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 100.

A controller 109 is electronically connected to electron beam tool 100. Controller 109 may be a computer configured to execute various controls of EBI system 10. While controller 109 is shown in FIG. 1 as being outside of the structure that includes main chamber 10, load/lock chamber 20, and EFEM 30, it is appreciated that controller 109 may be part of the structure. While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may also be applied to other tools that operate under the second pressure.

Figure 2:
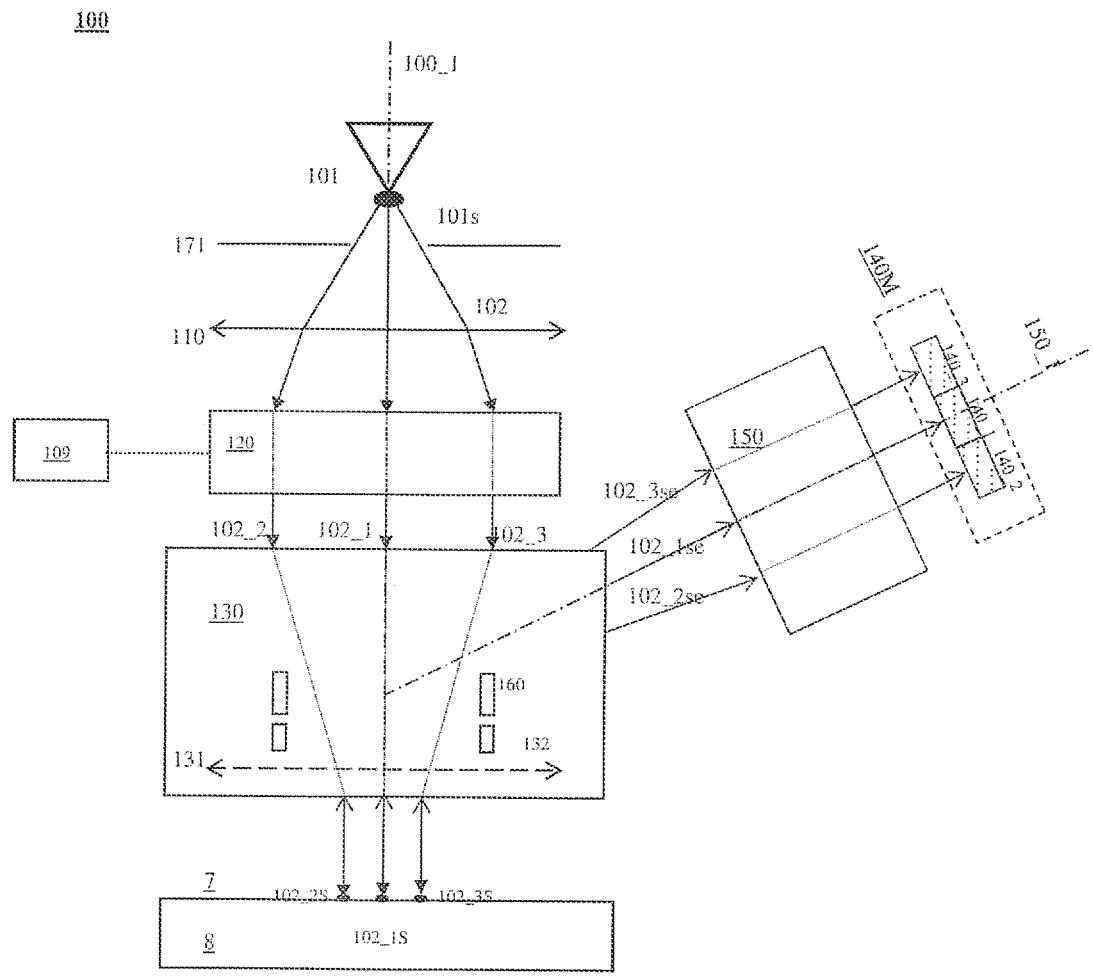
FIG. 2 is a schematic diagram illustrating an exemplary multi-beam apparatus that is part of the exemplary electron beam inspection system of FIG. 1, consistent with embodiments of the present disclosure.

Reference is now made to FIG. 2, which is a schematic diagram illustrating an exemplary multi-beam apparatus 100 that is part of the exemplary electron beam inspection system of FIG. 1, consistent with embodiments of the present disclosure. An electron beam tool 100 (also referred to herein as apparatus 100) comprises an electron source 101, a gun aperture plate 171, a condenser lens 110, a source conversion unit 120, a primary projection optical system 130, a sample 8 with sample surface 7, a secondary imaging system 150, and an electron detection device 140M. Primary projection optical system 130 may comprise an objective lens 131. Electron detection device 140M may comprise a plurality of detection elements 140_1, 140_2, and 140_3. A beam separator 160 and a deflection scanning unit 132 may be positioned inside primary projection optical system 130.

Electron source 101, gun aperture plate 171, condenser lens 110, source conversion unit 120, beam separator 160, deflection scanning unit 132, and primary projection optical system 130 may be aligned with a primary optical axis 100_1 of apparatus 100. Secondary imaging system 150 and electron detection device 140M may be aligned with a secondary optical axis 150_1 of apparatus 100.

Electron source 101 may comprise a cathode (not shown) and an extractor and/or anode (not shown), in which, during operation, electron source 101 is configured to emit primary electrons from the cathode and the primary electrons are extracted and/or accelerated by the extractor and/or the anode to form a primary electron beam 102 that forms a primary beam crossover (virtual or real) 101s. Primary electron beam 102 may be visualized as being emitted from primary beam crossover 101s.

Source conversion unit 120 may comprise an image-forming element array (not shown in FIG. 2), a field curvature compensator array (not shown in FIG. 2), an astigmatism compensator array (not shown in FIG. 2), and a beam-limit aperture array (not shown in FIG. 2). An example of source conversion unit 120 may be found in U.S. Pat. No. 9,691,586; U.S. Publication No. 2017/0025243: and International Application No. PCT/EP2017/084429, all of which are incorporated by reference in their entireties. The image-forming element array may comprise a plurality of micro-deflectors and/or micro-lenses to influence a plurality of primary beamlets 102_1, 102_2, 102_3 of primary electron beam 102 and to form a plurality of parallel images (virtual or real) of primary beam crossover 101s, one for each of the primary beamlets 102_1, 102_2, and 102_3. In some embodiments, such as when micro-deflectors are used to influence the plurality of primary beamlets 102_1, 102_2, 102_3 of primary beam 102, a plurality of virtual images of source 101 are formed. In other embodiments, such as when micro-lenses are used to influence the plurality of primary beamlets 102_1, 102_2, 102_3 of primary beam 102, a plurality of real images of source 101 are formed. The field curvature compensator array may comprise a plurality of micro-lenses to compensate field curvature aberrations of the primary beamlets 102_1, 102_2, and 102_3. The astigmatism compensator array may comprise a plurality of micro-stigmators to compensate astigmatism aberrations of the primary beamlets 102_1, 102_2, and 102_3. The beam-limit aperture array may be configured to limit diameters of individual primary beamlets 102_1, 102_2, and 102_3. FIG. 2 shows three primary beamlets 102_1, 102_2, and 102_3 as an example, and it is appreciated that source conversion unit 120 may be configured to form any number of primary beamlets. Source conversion unit 120 may be connected to controller 109, which may generate various control signals for controlling operations of EBI system 1 in FIG. 1.

Condenser lens 110 is configured to focus primary electron beam 102. Condenser lens 110 may further be configured to adjust electric currents of primary beamlets 1021, 102_2, and 102_3 downstream of source conversion unit 120 by varying the focusing power of condenser lens 110. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 110. Condenser lens 110 may be a movable condenser lens that may be configured so that the position of its first principle plane is movable. The movable condenser lens may be configured to be magnetic, which may result in off-axis beamlets 102_2 and 102_3 landing on a beamlet-limit mechanism (e.g. such beamlet-limit aperture array 121 in FIG. 3A) with rotation angles. The rotation angles change with the focusing power and the position of the first principal plane of the movable condenser lens. In some embodiments, the movable condenser lens may be a movable anti-rotation condenser lens, which involves an anti-rotation lens with a movable first principal plane. Movable condenser lens is further described in U.S. Publication No. 2017/025241, which is incorporated by reference in its entirety. Anti-rotation lens and anti-rotation movable condenser lens are further described in International Application No. PCT/EP2017/084429, which is incorporated by reference in its entirety.

Objective lens 131 (further explained below) may be configured to focus beamlets 102_1, 102_2, and 102_3 onto a sample 8 for inspection and may form, in the current embodiments, three probe spots 102_1s, 102_2s, and 102_3s on surface 7. Gun aperture plate 171, in operation, is configured to block off peripheral electrons of primary electron beam 102 to reduce Coulomb effect. The Coulomb effect may enlarge the size of each of probe spots 1021s, 102_2s, and 102_3s of primary beamlets 102_1, 102_2, 102_3, and therefore deteriorate inspection resolution.

Beam separator 160 may, for example, be a Wien filter comprising an electrostatic deflector generating an electrostatic dipole field E1 and a magnetic dipole field B (both of which are not shown in FIG. 2). In operation, beam separator 160 may be configured to exert an electrostatic force by electrostatic dipole field E1 on individual electrons of primary beamlets 102_1, 102_2, and 102_3. The electrostatic force is equal in magnitude but opposite in direction to the magnetic force exerted by magnetic dipole field BI of beam separator 160 on the individual electrons. Primary beamlets 102_1, 102_2, and 102_3 may therefore pass at least substantially straight through beam separator 160 with at least substantially zero deflection angles.

Deflection scanning unit 132, in operation, is configured to deflect primary beamlets 102_1, 102_2, and 102_3 to scan probe spots 102_1s, 102_2s, and 102_3s across individual scanning areas in a section of surface 7. In response to incidence of primary beamlets 1021, 102_2, and 102_3 at probe spots 102_1s, 102_2s, and 102_3s, electrons emerge from sample 8 and generate three secondary electron beams 102_1se, 102_2se, and 102_3se. Each of secondary electron beams 102_1se, 102_2se, and 102_3se typically comprise electrons having different energies including secondary electrons (having electron energy ≤50 eV) and backscattered electrons (having electron energy between 50 eV and the landing energy of primary beamlets 102_1, 102_2, and 102_3). Beam separator 160 is configured to deflect secondary electron beams 102_1se, 102_2se, and 102_3se towards secondary imaging system 150. Secondary imaging system 150 subsequently focuses secondary electron beams 102_1se, 102_2se, and 102_3se onto detection elements 140_1, 140_2, and 140_3 of electron detection device 140M. Detection elements 1401, 1402, and 140_3 are arranged to detect corresponding secondary electron beams 102_1se, 102_2se, and 102_3sc and generate corresponding signals which are sent to signal processing units (not shown), e.g. to construct images of the corresponding scanned areas of sample 8.

Figure 3A:
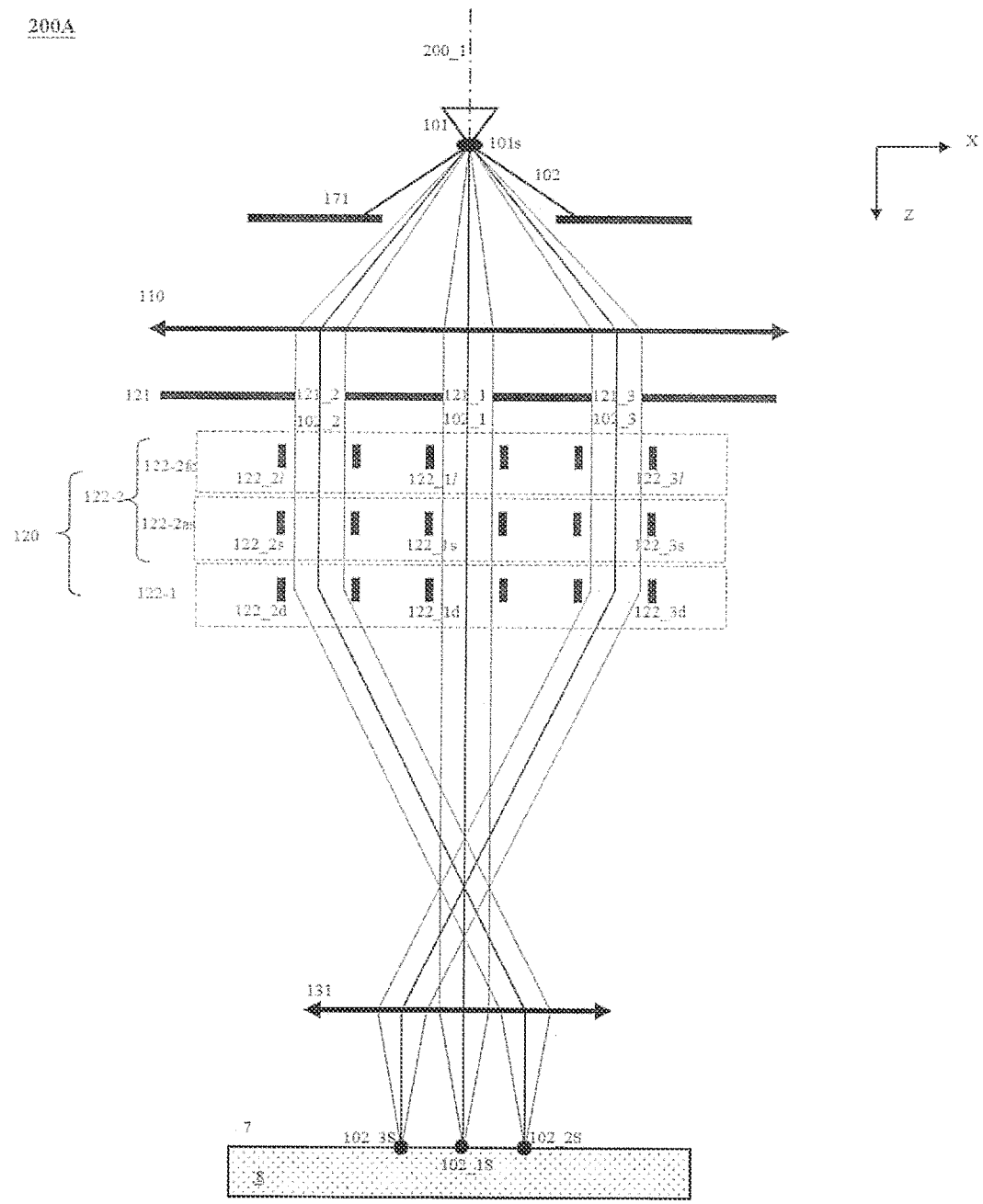
FIG. 3A is a schematic diagram of exemplary multi-beam apparatus illustrating an exemplary 21) configuration of source conversion unit of the exemplary electron beam inspection system of FIG. 1, consistent with embodiments of the present disclosure.

Reference is now made to FIG. 3A, which is a schematic diagram exemplary multi-beam apparatus 200A including exemplary configuration of source conversion unit 120 of the exemplary electron beam inspection system of FIG. 1, consistent with embodiments of the present disclosure. In some embodiments, apparatus 200A may comprise an election source 101, a gun aperture plate 171, a condenser lens 110, a source conversion unit 120, an objective lens 131, and a sample 8 with sample surface 7. Election source 101, gun aperture plate 171, condenser lens 110, source conversion unit 120, and objective lens 131 are aligned with a primary optical axis 200_1 of the apparatus. Electron source 101 generates a primary-electron beam 102 along primary optical axis 200_1 and with a source crossover (virtual or real) 101s. Gun aperture plate 171 cuts the peripheral electrons of primary electron beam 102 to reduce the Coulomb Effect. Primary-electron beam 102 may be trimmed into three beamlets 102_1, 102_2 and 102_3 by three beamlet-forming apertures (not shown) of a pre-beamlet-forming mechanism (not shown).

Condenser lens 110 may focus three beamlets 102_1~102_3 to become a parallel beam along primary optical axis 200_1 and perpendicularly incident onto source conversion unit 120.

In some embodiments, source conversion unit 120 may include a beamlet-limit aperture array 121 with beam-limit apertures 121_1, 121_2, and 121_3 configured to limit beamlets 102_1, 102_2, and 102_3 of primary electron beam 102. Source conversion unit 120 may also include an image-forming element array 122-1 with image-forming micro-deflectors. 122_1d, 122_2d, and 122_-3d, which are configured to deflect beamlets 102_1, 102_2, and 102_3 towards optical axis 200_1 to form probe spots, 102_1S, 102_2S, and 102_3S. Source conversion unit 120 may further comprise an aberration compensator array 122_2 configured to compensate aberrations of probe spots, 102_1S, 102_2S, and 102_3S. In some embodiments, aberration compensator array 122_2 may include a field curvature compensator array 122_2fc with micro-lenses, 122_1l, 122_21, and 122_31, which are configured to compensate field curvature aberrations of probe spots, 102_1S, 102_2S, and 102_3S, respectively. In some embodiments, aberration compensator array 122_2 may include an astigmatism compensator array 122_2as with micro-stigmators, 122_1s, 122_2s, and 122_3s, which are configured to compensate astigmatism aberrations of probe spots, 102_1S, 102_2S, and 102_3S, respectively. In some embodiments, image-forming element array 122_1, field curvature compensator array 122_2fc, and astigmatism compensator array 122_2as may comprise multiple layers of micro-deflectors, micro-lenses, and micro-stigmators, respectively. The multi-layer array is further described in U.S. Patent Application No. 62/567,134, which is incorporated herein in its entirety.

In source conversion unit 120, beamlets 102_1, 102_2 and 102_3 of primary electron beam 102 are respectively deflected by micro-deflectors 122_1d, 122_2d and 122_3d of image-forming element array 122-1 towards the primary optical axis 200_1. It is appreciated that beamlet 1021 may already be on optical axis 2001 prior to reaching micro-deflector 122_1d; accordingly, beamlet 102_1 may not be deflected by micro-deflector 122_1d.

Objective lens 131 focuses beamlets onto surface 7 of sample 8, i.e. projecting the three virtual images onto surface 7. The three images formed by three beamlets 102_1~102_3 on surface 7 form three probe spots 102_1S, 102_2S and 102_3S thereon. The deflection angles of beamlets 102_1~102_3 are adjusted to reduce the off-axis aberrations of three probe spots 102_1S-102_3S due to objective lens 131, and the three deflected beamlets consequently pass through or approach the front focal point of objective lens 131. A deflection angle used to form a probe spot corresponds with a radial shift (distance from optical axis 200_1) of the beamlet. For example, beamlets having the same radial shifts have the same or substantially the same deflection angles. Moreover, the deflection directions of beamlets are related to their corresponding radial shift directions. Furthermore, the aberrations of beamlets (e.g. field curvature aberrations and astigmatism aberrations) having the same or substantially same radial shifts are same or substantially same, and the directions of astigmatism aberrations are related to the directions of their radial shifts.

Figure 3B:
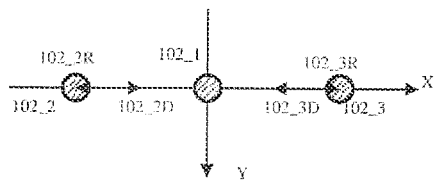
FIGS. 3B and 3C illustrate exemplary deflection characteristics relative to corresponding radial directions.
Figure 3C:
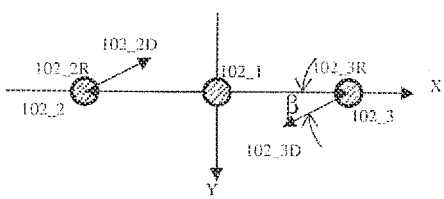

The deflection direction of a beamlet may also change based on the presence of a magnetic field at electron source 101 or at sample 8. In some embodiments, neither electron source 101 nor sample 8 may be immersed in a magnetic field (not shown). In such embodiments, the deflection direction is opposite to the radial shift direction, as shown in FIG. 3B. In FIG. 3B, deflection direction 102_2D and 102_3D of beamlets 102_2 and 102_3 are opposite to their corresponding radial shift directions 102_2R and 102_3R. In other embodiments, at least one of electron source 101 and sample 8 may be immersed in a magnetic field. In such embodiments, the deflection direction is rotated a deflection rotation angle with respect to the radial shift direction, as shown in FIG. 3C. In FIG. 3C, deflection directions 102_2D and 102_3D of beamlets 102_2 and 102_3 are rotated for deflection rotation angles β with respect to their corresponding radial shift directions 102_2R and 102_3R.

Figure 3D:
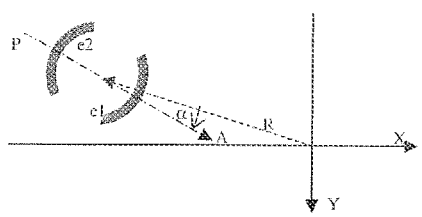
FIG. 3D illustrates an exemplary multi-pole structure having a dipole configuration.
Figure 3E:
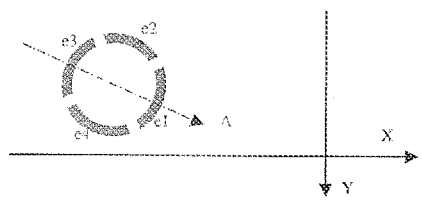
FIG. 3E illustrates an exemplary multi-pole structure having a quadrupole configuration.
Figure 3F:
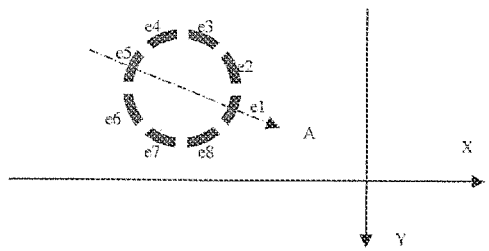
FIG. 3F illustrates an exemplary multi-pole structure having an octupole configuration.

Reference is now made to FIG. 3D, which illustrates an exemplary multi-pole structure having a dipole configuration, consistent with embodiments of the present disclosure. A multi-pole structure includes two or more segmented electrodes. In some embodiments, a multi-pole structure may be radially shifted from optical axis 200_1 of FIG. 3A. The multi-pole structure may have a central axis and one or more symmetry planes P bisecting a pair of opposite segmented electrodes. An orientation direction A of a multi-pole structure is a direction of one of the symmetry planes and is perpendicular to the central axis. A radial shift direction R of a multi-pole structure is a direction from optical axis 200_1 of FIG. 3A to the central axis. An orientation angle α is formed by orientation direction A and radial shift direction R in the exemplary dipole configuration shown in FIG. 3D. Similarly, exemplary multi-pole structures with quadrupole and octupole configurations are shown in FIG. 3E and FIG. 3F, respectively. A dipole structure may only generate a dipole field in its orientation direction (e.g. orientation direction A in FIG. 3D). Therefore, if a dipole structure is used as a micro-deflector, the dipole structure may be positioned in a way that the orientation direction matches the deflection direction of a corresponding beamlet.

In some embodiments, a dipole field, which is an electric field, is generated by a micro-deflector and is substantially perpendicular to primary optical axis 200_1. In FIG. 3A, the path of a beamlet when the beamlet entered source conversion unit 122 is parallel to primary optical axis 200_1. Further, when the electric field is present, the electric field may bend the beamlet in a direction divergent (e.g., not parallel) to the path of the beamlet when the beamlet enters source conversion unit 122, which in FIG. 3A is also divergent from primary optical axis 200_1. For example, in FIG. 3A 122_2d may be a multi-pole micro-deflector, with each pair of poles forming the poles of a dipole. When an excitation is applied to the dipoles, an electric field is formed between the poles, with the electric field being substantially perpendicular to primary optical axis 200_1 and the path of beamlet 102_2 when beamlet 102_2 entered source conversion unit 120, which are both parallel to the central axis of micro-deflector 122_2d. Further, the electric field deflects beamlet 102_2 in a direction divergent from primary optical axis 200_1, which is the path of beamlet 102_2 when beamlet 102_2 entered source conversion unit 120, and from the central axis of deflector 122_2d.

If a quadrupole structure or an octupole structure is used as a micro-defector, a quadrupole structure or an octupole structure may generate a dipole field in any direction perpendicular to its central axis by controlling voltages applied to each electrode. Moreover, a quadrupole structure may only generate a quadrupole field aligned with its orientation direction (e.g. orientation direction A in FIG. 3E). Therefore, if a quadrupole structure is used as a micro-stigmator, the quadrupole structure may be positioned in a way that the orientation direction matches the astigmatism aberration direction of a corresponding beamlet. If an octupole structure is used as a micro-stigmator, there is no such limitation because it may generate a quadrupole field in any direction perpendicular to its central axis by controlling voltages applied to each electrode.

For example, when one voltage is applied to all electrodes, the multi-pole structure is configured to function as a micro-lens. If the multi-pole structure has four segmented electrodes (i.e. a quadrupole structure) and two voltages of the same absolute value but opposite polarities are applied to the two pairs of opposite electrodes, the multi-pole structure is configured to function as a micro-stigmator having a quadrupole field that is changeable in value but fixed in direction. For example, in FIG. 3E, when V1 is applied to electrodes e1 and e3, and when −V1 is applied to electrodes e2 and e4, the multi-pole structure functions as such kind of a micro-stigmator. The quadrupole field can be changed in value by varying V1. If the multi-pole structure has an eight segmented electrode (i.e. an octupole structure) and two voltages that have the same absolute value and opposite in polarity are applied to two pairs of opposite electrodes and other two voltages that have the same absolute value and opposite in polarity are applied to other two pairs of opposite electrodes, the multi-pole structure is configured to function as a micro-stigmator whose quadrupole field is changeable in both value and direction. For example, in FIG. 3F, when V1 is applied to electrodes e1 and e5, −V1 is applied to electrodes e3 and e7, V2 is applied to electrodes c2 and e6, and −V2 is applied to electrodes e4 and e8, the multi-pole structure functions as such kind of a micro-stigmator. The quadrupole field can be changed in value and direction by varying V1 and V2. If the multi-pole structure has four segmented electrodes (i.e. a quadrupole structure) and two voltages having the same absolute value and opposite polarities are applied to one pair of opposite electrodes, and other two voltages of the same absolute value and opposite polarities are applied to the other pair of opposite electrodes, the multi-pole structure is configured to function as a micro-deflector. For example, in FIG. 3E, when V1 is applied to c2, −V1 is applied to e4, V2 is applied to e1, and −V2 is applied to e3, the multi-pole structure functions as a micro-deflector. The dipole field can be changed in value and direction by varying V1 and V2.

Figure 4A:
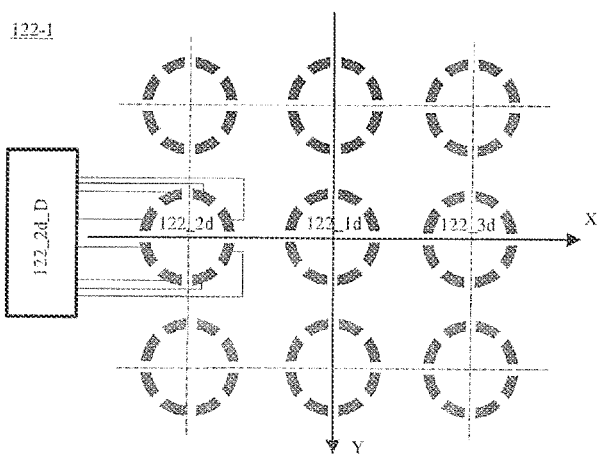
FIGS. 4A and 4B are schematic diagrams illustrating exemplary configurations of a multi-pole structure array.

Reference is now made to FIG. 4A, which is a schematic diagram illustrating an exemplary configuration of an image-forming element array of FIG. 3A, consistent with embodiments of the present disclosure. In this embodiment, each micro-deflector comprises an octupole structure with eight segmented electrodes, which are excited individually and independently. For example, in this embodiment, the eight electrodes of micro-deflector 122_2d are individually driven by eight outputs of an excitation driver 122_2d_D. Furthermore, nine micro-deflectors need to be controlled separately. Therefore, for this three-by-three array structure, a total of nine drivers and seventy-two connecting circuit lines are required. And as more beamlets are used, the circuitry connecting the micro-deflectors become increasingly complicated and the excitation voltages in the connecting lines become increasingly higher. This increasing level of complexity may present issues as the number of beamlets grows. First, the electric interference between adjacent connecting lines may cause an issue in maintaining signal integrity. Moreover, the electric field between two adjacent lines may cause an electric arcing if voltages are sufficiently high. Second, when those drivers are located inside of one or more vacuum chambers, the heat generated by those drivers may deteriorate performance of the system, and the outgassing of the heated drivers may deteriorate the level of the vacuum state. Similar issues are present in a field curvature compensator array with single-pole structures, shown in FIG. 4B. A single-pole structure includes one or more annular electrodes. Consequently, the increasing level of complexity presents issues with increasing the number of beamlets used by a multi-beam system, and thereby limit throughput. One solution (not shown) is proposed in U.S. Patent Application No. 62/567,134, which is incorporated by reference in its entirety. The solution is to exchange one or more micro-deflectors of 122-1 in FIG. 4A with corresponding micro-lenses of 122-2fc in FIG. 4B, such as exchanging micro-deflector 122_2d of 122-1 with micro-lens 122_21 of 122-2fc. This disclosure proposes other solutions described below.

Figure 5A:
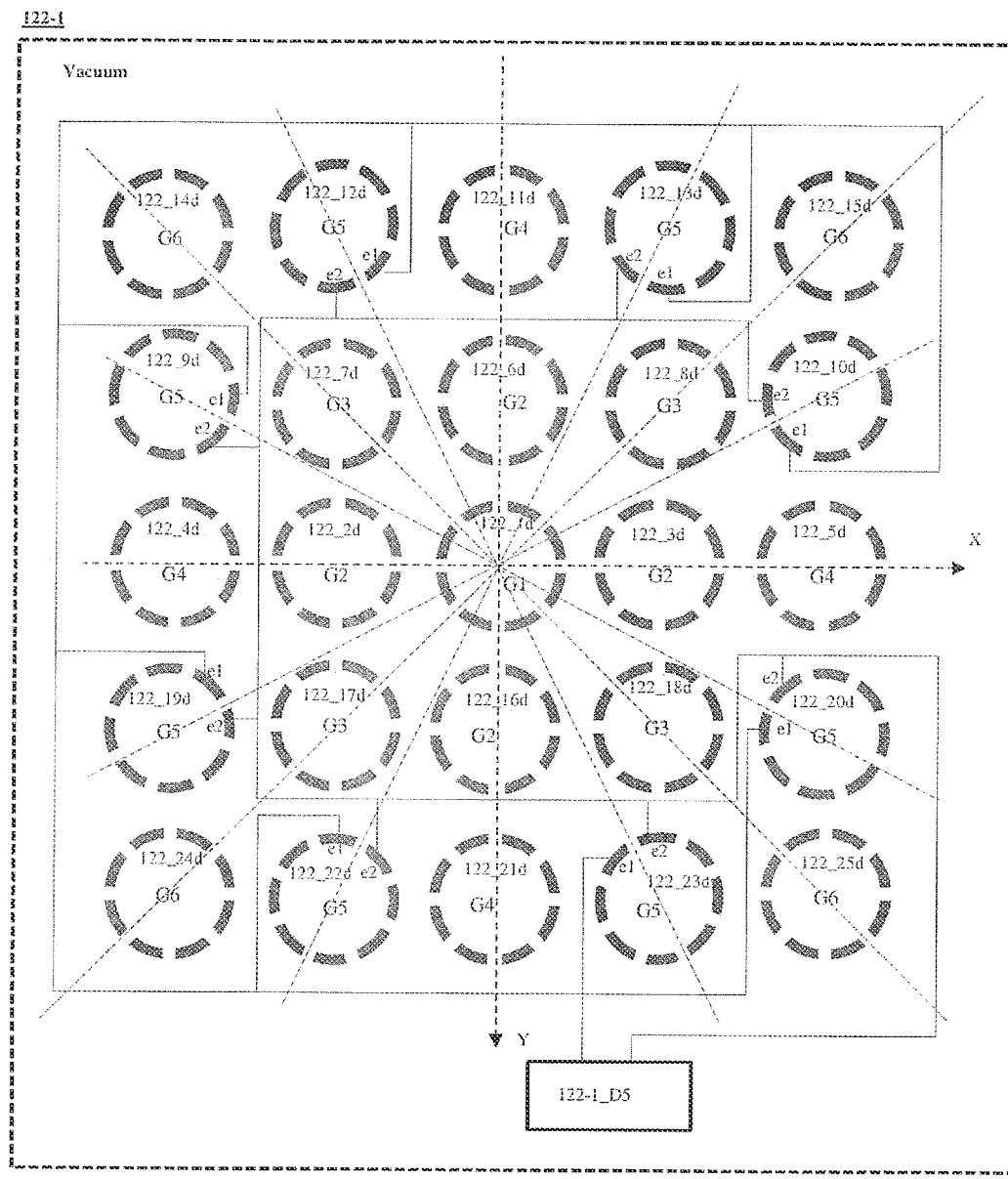
FIG. 5A is a schematic diagram illustrating an exemplary configuration of an image-forming element array, consistent with embodiments of the present disclosure.
Figure 5B:
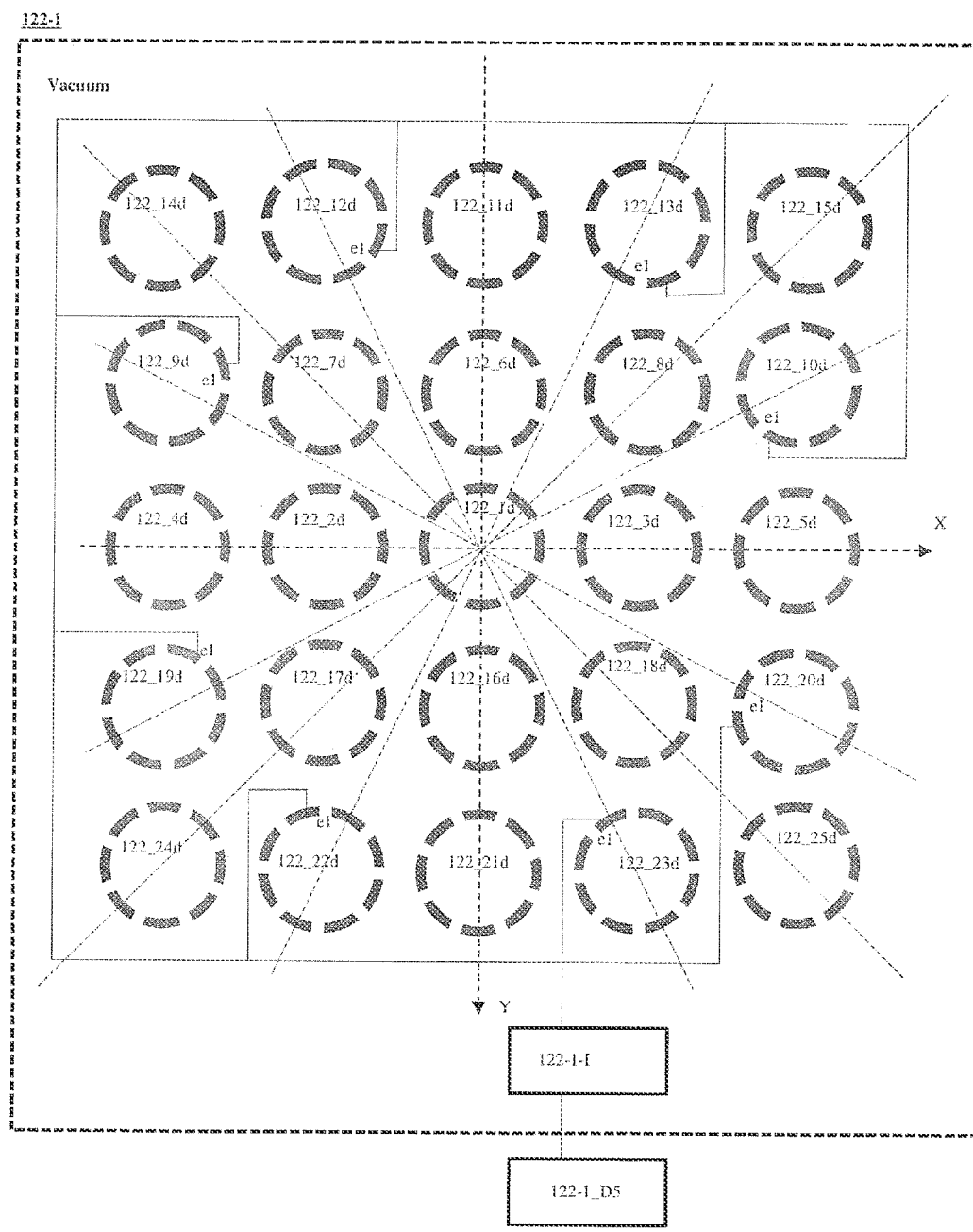
FIG. 5B is a schematic diagram illustrating an exemplary configuration of another image-forming element array, consistent with embodiments of the present disclosure.

Reference is now made to FIG. 5A, which is a schematic diagram illustrating an exemplary configuration of an image-forming element array 122-1, consistent with embodiments of the present disclosure. In some embodiments, image-forming array 122-1 may comprise a plurality of micro-deflectors 122_1d-122_25d, which are positioned to have a same orientation angles α. In FIG. 5A, the orientation angles α are equal to 22.5 degrees as an example. In FIG. 5B, the orientation angles are equal to zero degree as another example. For those micro-deflectors with same radial shifts from the optical axis (200_1 in Z axis in FIG. 3A) of a multi-beam apparatus, such as micro-deflectors 122_2d, 122_3d, 122_6d and 122_16d, the deflection angles for the corresponding beamlets may be equal or substantially equal. Furthermore, as described in FIGS. 3B and 3C, the deflection rotation angles β of micro-deflectors 122_1d-122_25d may be equal or substantially equal for the corresponding beamlets. For example, in some embodiments in which neither electron source 101 nor sample 8 are immersed in a magnetic field, the deflection rotation angles β may be equal to zero degree. In other embodiments in which at least one of electron source 101 and sample 8 is immersed in a magnetic field, the deflection rotation angles β may be 1 mrad (milliradian). Therefore, in image-forming element array 122-1, a group of multi-pole deflectors having same or substantially same radial shifts and same or substantially same orientation angles α may be grouped to share a common driver.

Accordingly, in some embodiments, micro-deflectors 122_1d-122_25d of image-forming element array 122-1 may be grouped into 6 different groups with each group including one or more micro-deflectors. Each micro-deflector in a given group may be driven by a corresponding group driver. For example, group 1 (designated G1 in FIG. 5A) may comprise micro-deflector 122_1d. Group 2 (G2) may comprise 122_2d, 122_3d, 122_6d, and 122_16d. Group 3 (G3) may comprise 122_7d, 122_8d, 122_17d, and 122_18d. Group 4 (G4) may comprise 122_4d, 122_5d, 122_11d, and 122_21d. Group 5 (G5) may comprise 122_9d, 122_10d, 122_12d, 122_13d, 122_19d, 122_20d, 122_22d, and 122_23d. Group 6 (G6) may comprise 122_14d, 122_15d, 122_24d, and 122_25d. Micro-deflector 122_1d in group 1 may have the smallest radial shift because it is positioned on the optical axis. Micro-deflectors 122_14d, 122_15d, 122_24d, and 122_25d in group 6 may have the largest radial shifts because they are positioned at each corner of the array and farthest from the optical axis. Furthermore, in such embodiments, micro-deflectors 122_14d, 122_15d, 122_24d, and 122_25d in group 6 may be driven by the highest deflection voltages to deflect the corresponding beamlets by greater deflection angles, as micro-deflectors in groups with larger radial shifts deflect beamlets more strongly towards the optical axis. While FIGS. 5A and 5B show a five-by-five array configuration, it is appreciated that the array may be any size.

In some embodiments, micro-deflectors 122_1d-122_25d may be grouped based on proximity of radial shift from the optical axis. For example, the micro-deflectors having radial shift differences within a 10% range may be grouped together and connected to a corresponding group driver. In some embodiment, auxiliary micro-deflector array 122-1a (shown in FIG. 5C) may be used to compensate the influences of the 10% range. In some embodiments, the influence of the 10% range may be compensated by appropriately designing the diameters of the micro-deflectors. For example, if a first micro-deflector having a first diameter is radially shifted further away from the optical axis than a second micro-deflector having a second diameter is located, the first diameter may be decreased so that the same voltage may still be applied to the first and second micro-deflectors while compensating the difference in radial shift amounts. That is, the same voltage applied to both micro-deflectors may result in a larger deflection angle caused by the first micro-deflector having the smaller diameter when compared to the deflection angle caused by the second micro-deflector having the larger diameter. While the references are made to micro-deflector as an example, it is appreciated that the same technique of varying diameter may be used with micro-lenses and micro-stigmators.

In some embodiment, micro-deflectors 122_1d-122_25d of image-forming element array 122-1 may comprise a plurality of segmented electrodes. FIG. 5A shows eight segmented electrodes (octupole) in each micro-deflector as an example, and it is appreciated that micro-deflector may be configured to have any even number of segmented electrodes. The segmented electrodes in each micro-deflector may be labeled according to an angle from the orientation direction of the micro-deflector. For example, as shown in FIG. 5A, a first electrode positioned at a first angle from an orientation direction may be considered as electrode e1, and a second electrode positioned at a second angle from an orientation direction may be considered as electrode e2. FIG. 5A shows electrodes e1 and c2 of the multi-pole deflectors of group 5 simply as an example, and it is appreciated that any one of eight electrodes may be considered as electrode e1. In such embodiment, electrodes e1 in the multi-pole deflectors of group 5 (122_9d, 122_10d, 122_12d, 122_13d, 122_19d, 122_20d, 122_22d, and 122_23d) may be connected and driven with a first voltage by a corresponding group driver 122-1_D5. Similarly, electrodes e2 in group 5 may be connected and driven with a second voltage by driver 122-1_D5. In such embodiments, the remaining electrodes in group 5 (e3-e8, not shown) may be also driven with respective voltages by driver 122-1_D5. Moreover, while FIG. 5A shows driver 122-1_D5 positioned within the vacuum with image-forming element array 122-1, it is appreciated that driver 122-1_D5 may be positioned outside the vacuum as shown in FIG. 5B. Compared to the embodiment in FIG. 4A, this embodiment reduces the number of drivers from twenty-five drivers (one for each micro-deflector) to only six drivers and reduces the number of connecting circuits in the array configuration by driving a common set of voltages to the micro-deflectors in a group.

Reference is now made to FIG. 5B, which is a schematic diagram illustrating an exemplary configuration of an image-forming element array 122-1, consistent with embodiments of the present disclosure. FIG. 5B shows a configuration of micro-deflectors 122_1d-122_25d each having an orientation angle equal to zero degree. Furthermore, in some embodiment, as shown in FIG. 5A, drivers (e.g. 122-1_D5) may be positioned inside of a vacuum. In other embodiments, as shown in FIG. 5B, drivers (e.g. 122-1_D5) may be positioned outside of a vacuum to avoid outgassing while an interface unit 122-1_I is positioned inside of the vacuum configured to provide connections between micro-deflectors, 122_1d-122_25d, and drivers (e.g. 122-1_D5) outside of vacuum.

Figure 5C:
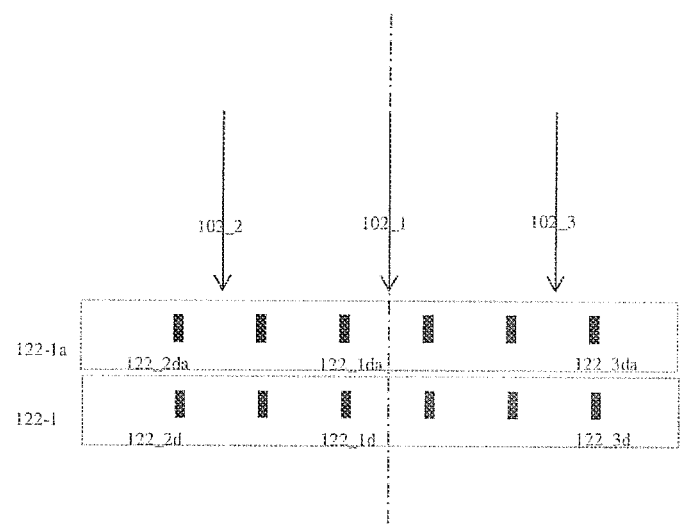
FIG. 5C is a schematic diagram illustrating an exemplary configuration including an image-forming element array and an auxiliary micro-deflector array, consistent with embodiments of the present disclosure.

Reference is now made to FIG. 5C, which is a schematic diagram illustrating an exemplary source conversion unit with an image-forming element array 122-1 and an auxiliary micro-deflector array 122-1a, consistent with embodiments of the present disclosure. As explained with respect to FIG. 5A, all micro-deflectors in a given group may be driven by a corresponding group driver. However, some inconsistencies may occur (e.g. based on manufacturing errors) that may result in slight differences on the deflection angles or deflection directions among micro-deflectors within the same group. In some embodiments, these inconsistencies may be compensated with an auxiliary array, such as auxiliary micro-deflector array 122-1a in FIG. 5C. For example, image-forming element array 122-1 may have the array configuration shown in FIG. 5A with six groups based on the radial shifts. Auxiliary micro-deflector array 122-1a may comprise an array of micro-deflectors similar to the configuration of image-forming element array 122-1. Each micro-deflector in image-forming element array 122-1 and one corresponding micro-deflector in auxiliary micro-deflector array 122-1a are aligned with each other such that a pair of micro-deflectors from these two arrays may provide the deflection angle fora corresponding beamlet. A difference of auxiliary micro-deflector array 122-1a from image-forming element array 122-1 is that micro-deflectors in the auxiliary array may not be grouped. The micro-deflectors in the auxiliary array may be driven individually and separately as shown in FIG. 4A to provide a complete independent controllability over each micro-deflector. For example, assuming that the intended deflection angles of micro-deflectors 122_14d, 122_15d, 122_24d, and 122_25d in group 6 of image-forming element array 122-1 are equal to 30 mrad, due to the previously mentioned inconsistencies, the actual deflection angles generated by micro-deflectors 122_14d, 122_15d, 122_24d, and 122_25d may be 30.1, 30, 29.8, 29.9 mrad, respectively, when a set of voltages is applied. In such a case, the corresponding micro-deflectors in auxiliary micro-deflector array 122-1a may be individually controlled to provide further deflection of –0.1, 0, 0.2, 0.1 mrad, respectively. As a result, beamlets exiting image-forming element array 122-1 and auxiliary micro-deflector array 122-1a are all deflected 30 mrad. Although many more drivers are required for auxiliary micro-deflector array 122-1a, as it does not utilize grouping technique, the problem is not as severe as in image-forming element array 122-1 because the voltages for the micro-deflectors in the auxiliary array are very small, as shown in the example above. In addition, due to the previously mentioned inconsistencies, the actual deflection rotation angles β of micro-deflectors 122_14d, 122_15d, 122_24d, and 122_25d may be a little different from intended ones respectively. In such a case, the corresponding micro-deflectors in auxiliary micro-deflector array 122-1a may be individually controlled to provide further deflections to meet the required deflection rotation angles Q.

Figure 6A:
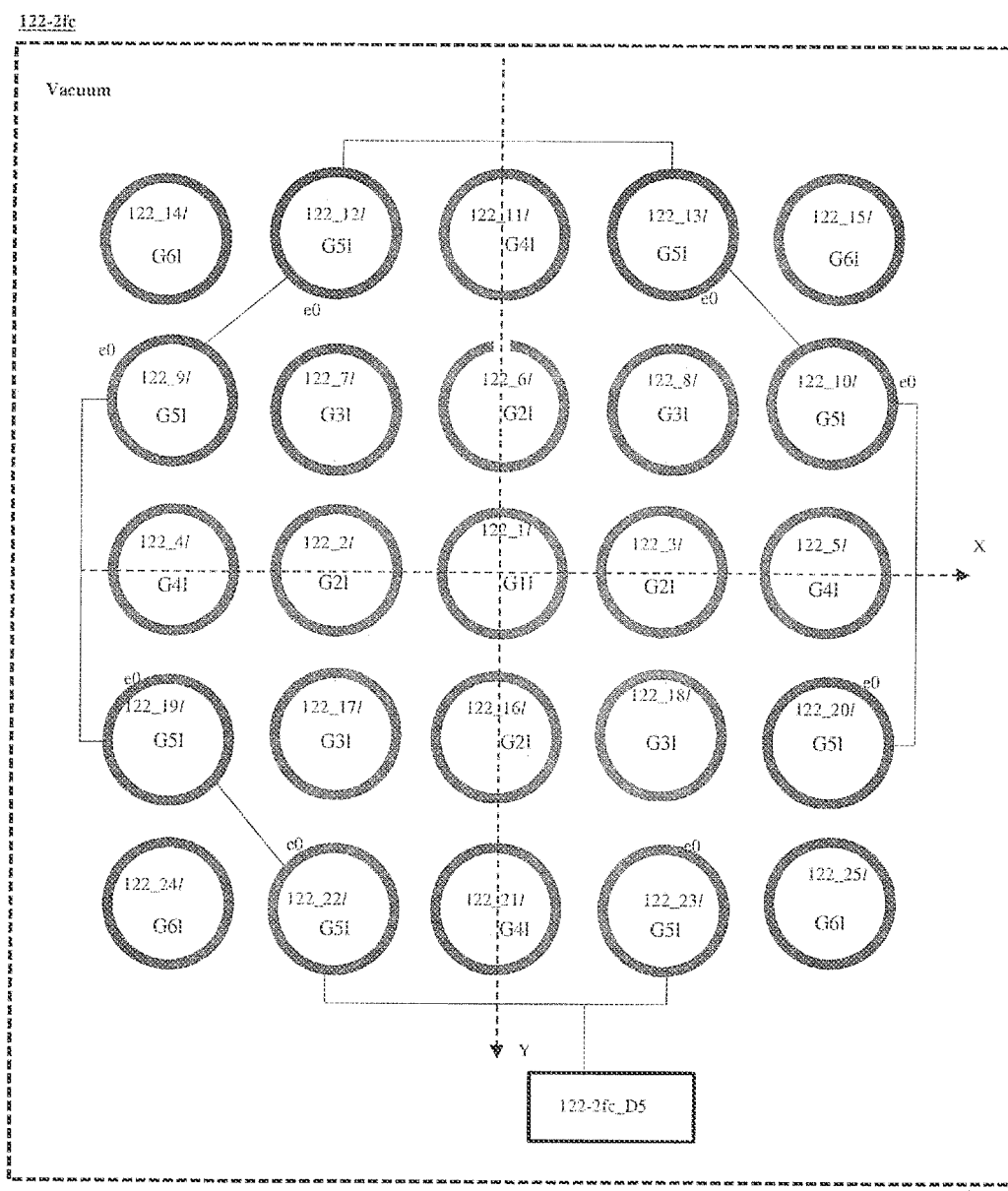
FIG. 6A is a schematic diagram illustrating an exemplary configuration of a field curvature compensator array, consistent with embodiments of the present disclosure.
Figure 6B:
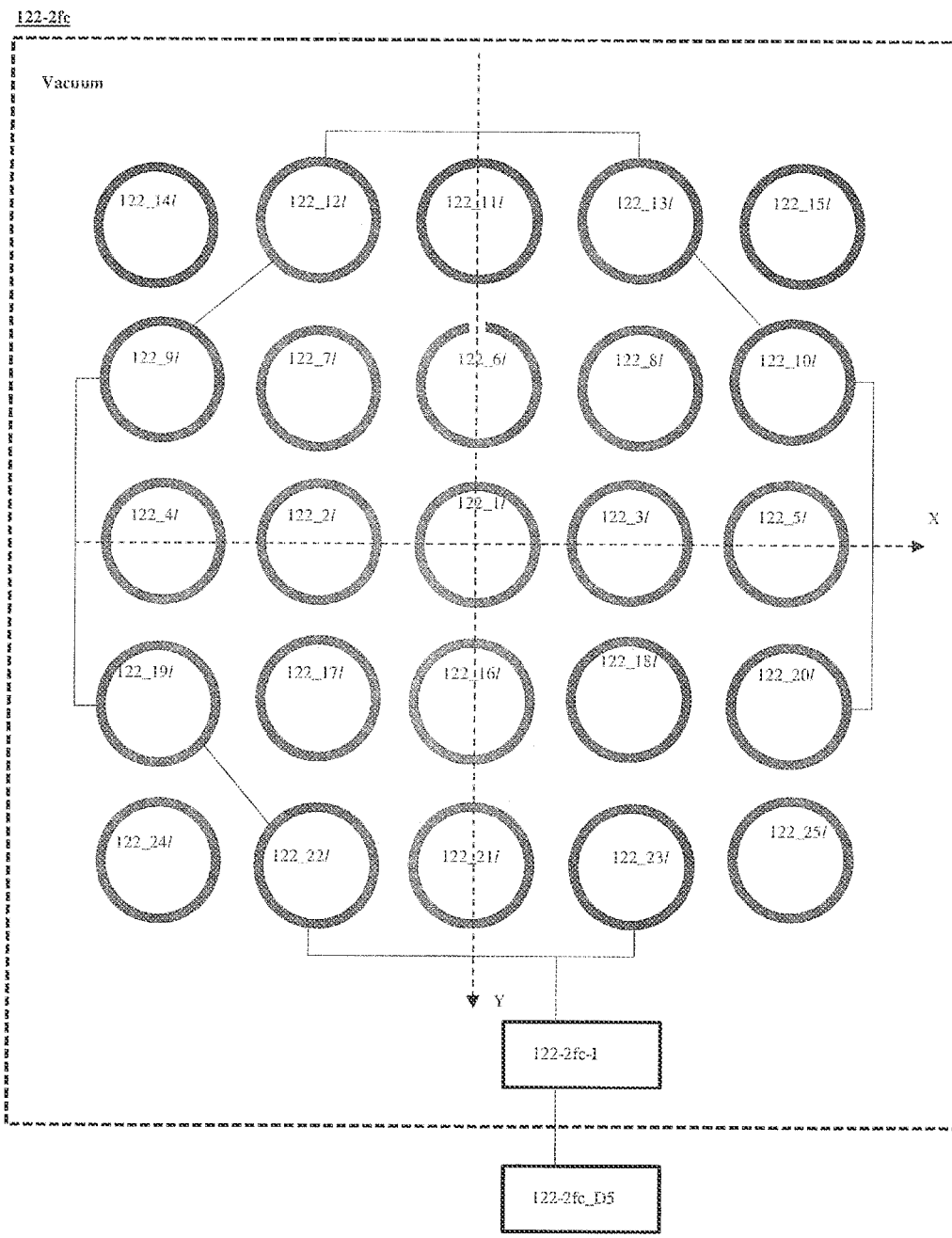
FIG. 6B is a schematic diagram illustrating another exemplary configuration of a field curvature compensator array, consistent with embodiments of the present disclosure.

Reference is now made to FIGS. 6A and 6B, which are schematic diagrams illustrating exemplary configurations of a field curvature compensator array 122-2fc, consistent with embodiments of the present disclosure. Field curvature compensator array 122-2fc may comprise a plurality of micro-lenses, 122_1l-122_25l. FIGS. 6A and 6B show single-pole micro-lenses 122_1l-122_25l as an example. While micro-lenses 122_1l-122_25l may have single-pole structures, it is appreciated that some or all of micro-lenses 122_1l-122_25l may have multi-pole structures, wherein the segmented electrodes within each multi-pole structure are configured to be driven by a common voltage. The grouping technique and other embodiments described with respect to FIGS. 5A and 5B may also apply to field curvature compensator array 122-2fc. Furthermore, in some embodiment, as shown in FIG. 6A, drivers (e.g. 122-2fc_D5) may be positioned inside of a vacuum. In other embodiments, as shown in FIG. 6B, drivers (e.g. 122-2fc_D5) may be positioned outside of a vacuum to avoid outgassing while an interface unit 122-2fc_I is positioned inside of the vacuum and configured to provide connections between micro-deflectors, 122_1l-122_25l, and drivers (e.g. 122-2fc_D5) outside of vacuum. One difference is that the group of micro-lenses with smaller-radial shifts may use a higher focusing voltage. While FIGS. 6A and 6B show five-hy-five array configuration, it is appreciated that the array may be any size.

Figure 4B:
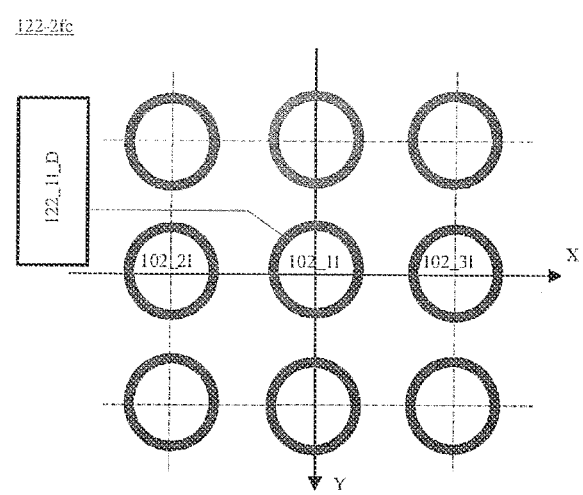
Figure 6C:
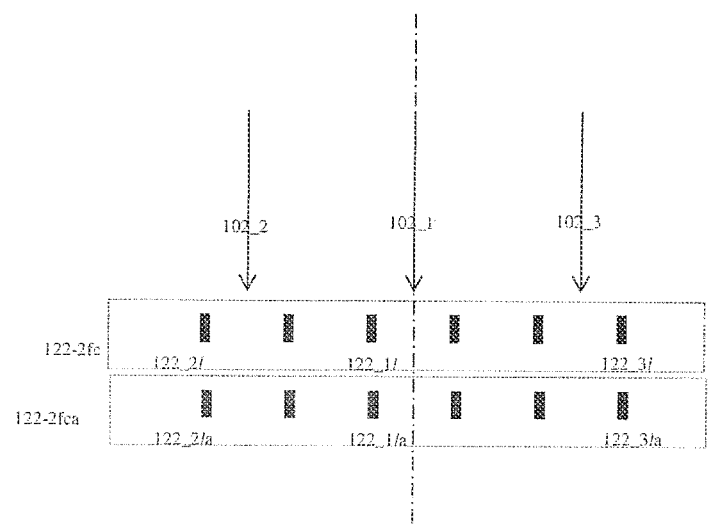
FIG. 6C is a schematic diagram illustrating a portion of an exemplary configuration including a field curvature compensator array and an auxiliary micro-lens array, consistent with embodiments of the present disclosure.

Reference is now made to FIG. 6C, which is a schematic diagram illustrating an exemplary source conversion unit in a multi-beam apparatus with a field curvature compensator array 122-2*fc* and an auxiliary micro-lens array 122-2*fca*, consistent with embodiments of the present disclosure. Auxiliary micro-lens array 122-2*fca* may compensate the inconsistencies of field curvature compensator array 122-21*e* with respect to field curvature aberrations. Each micro-lens in field curvature compensator array 122-2*fc* and one corresponding auxiliary micro-lens in auxiliary micro-lens array 122-2*fca* are aligned with each other such that a pair of micro-lenses from these two arrays may influence the field curvature aberration for a corresponding beamlet. A difference of auxiliary micro-lens array 122-2*fca* from field curvature compensator array 122-2*fc* is that micro-lenses in the auxiliary array may not be grouped. The micro-lenses in the auxiliary array may be driven individually and separately as shown in FIG. 4B to provide a complete independent controllability over each micro-lens. While FIG. 6C shows auxiliary micro-lens array 122-2*fca* positioned below field curvature compensator array 122-2*fc*, it is appreciated that auxiliary micro-lens array 122-2*fca* may be positioned above field curvature compensator array 122-2*fc*.

Figure 7A:
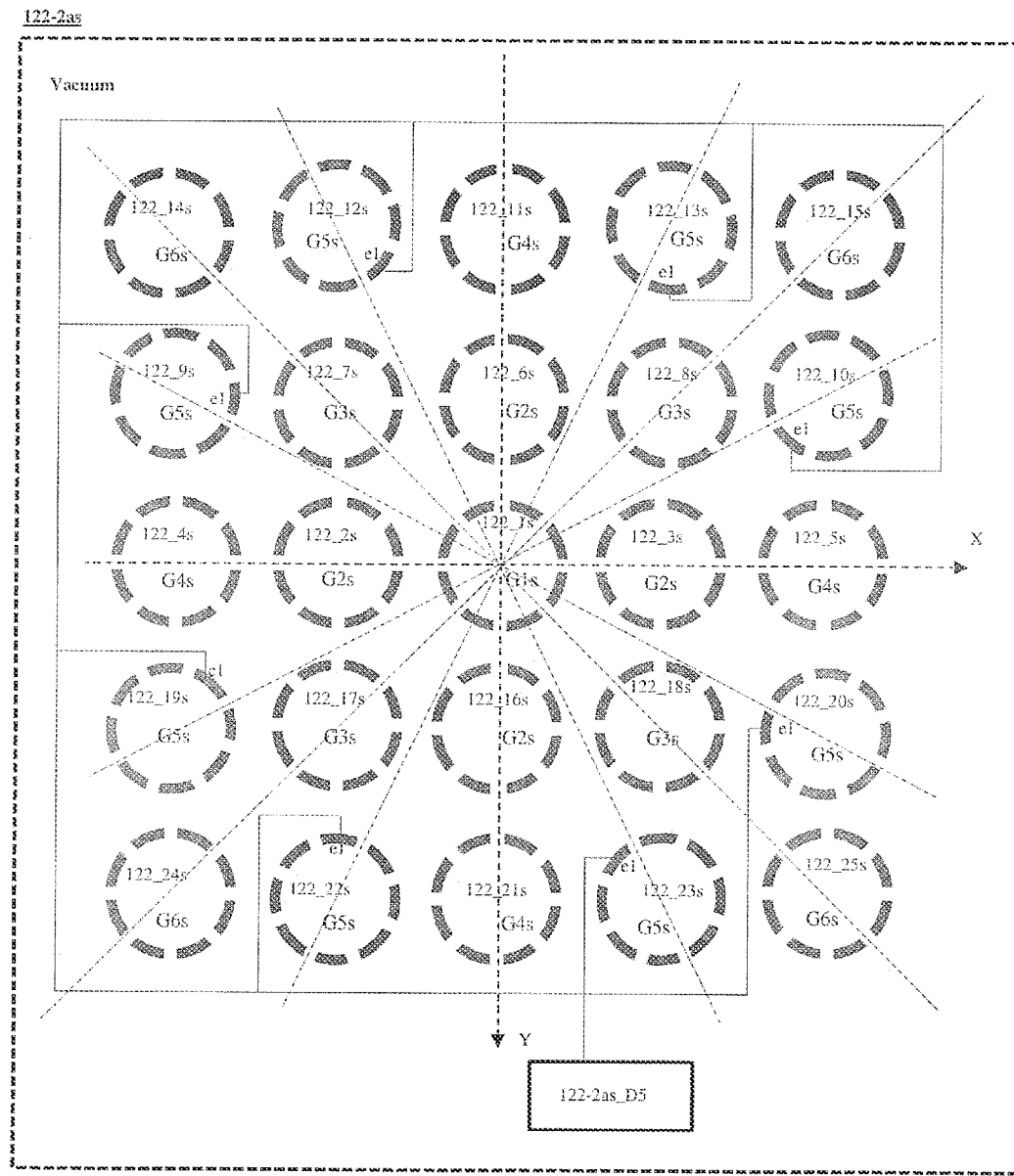
FIG. 7A is a schematic diagram illustrating an exemplary configuration of an astigmatism compensator array, consistent with embodiments of the present disclosure.
Figure 7B:
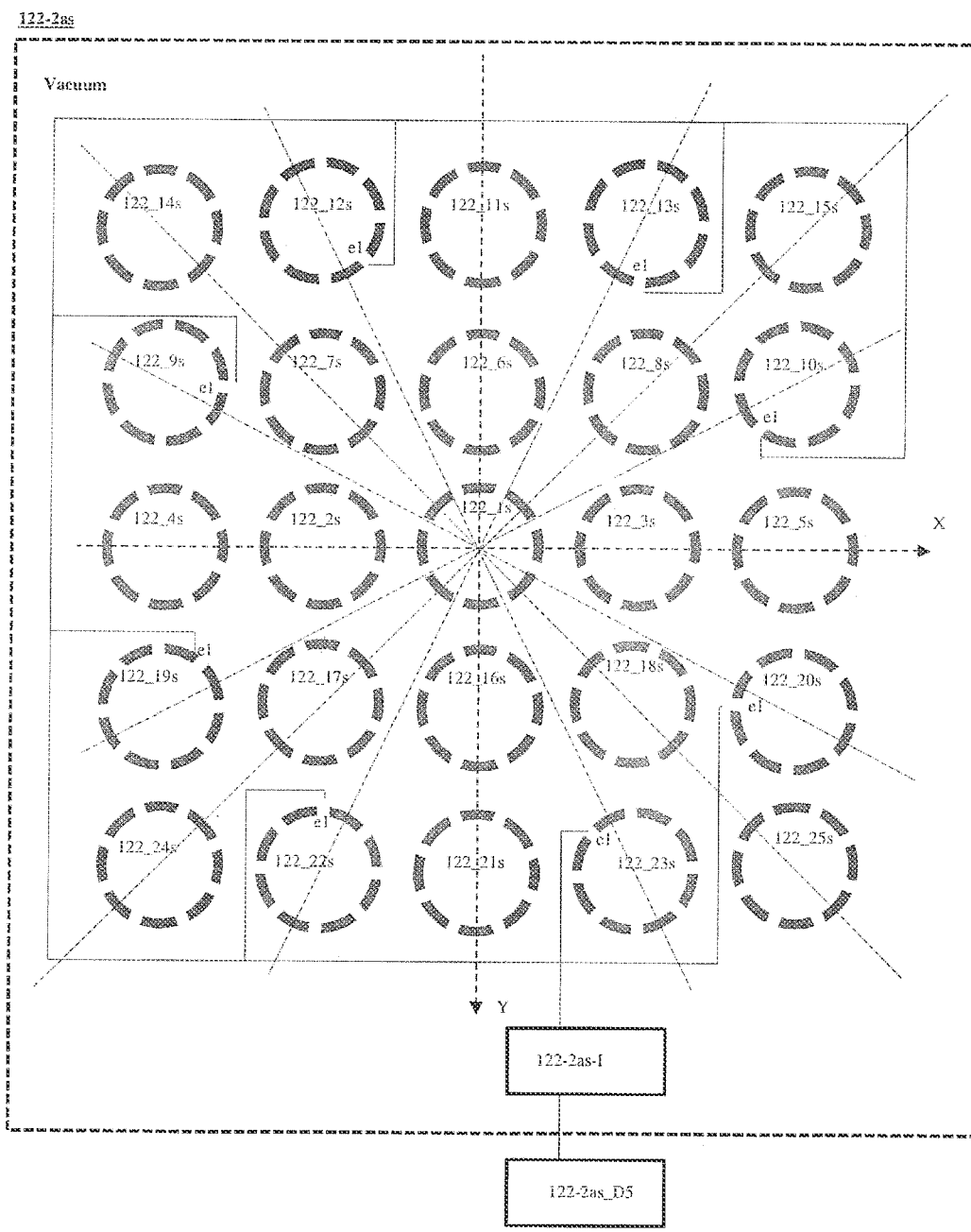
FIG. 7B is a schematic diagram illustrating another exemplary configuration of an astigmatism compensator array, consistent with embodiments of the present disclosure.

Reference is now made to FIGS. 7A and 7B which are schematic diagrams illustrating exemplary configurations of an astigmatism compensator array 122-2*as*, consistent with embodiments of the present disclosure. FIGS. 7A and 7B show micro-stigmators 122_1*s*-122_25*s* having octupole structures, as an example, and it is appreciated that some or all of micro-stigmators 122_1*s*-122_25*s* may have multipole structures with any even number of segmented electrodes. The grouping technique and other embodiments described with respect to FIGS. 5A and 5B may also apply to astigmatism compensator array 122-2*as*. Furthermore, in some embodiment, as shown in FIG. 7A, drivers (e.g. 122-2*as*_D5) may be positioned inside of a-vacuum. In other embodiments, as shown in FIG. 7B, drivers (e.g. 122-2*as*_D5) may be positioned outside of a vacuum to avoid outgassing while an interface unit 122-2*as*_I is positioned inside of the vacuum and configured to provide connections between micro-deflectors, 122_1*s*-122_25*s*, and drivers (e.g. 122-2*as*_D5) outside of vacuum. While FIGS. 7A and 7B show a five-by-five array configuration, it is appreciated that the array may be any size.

In some embodiments, if voltages applied to micro-stigmators of astigmatism compensator array 122-2*as* are not high, astigmatism compensator array 122-2*as* may be used to perform the function of an auxiliary micro-deflector array or an auxiliary micro-lens array, or both. In some embodiments, astigmatism compensator array 122-2*as* may perform the function of an auxiliary array (e.g. auxiliary micro-deflector array 122-1*a* in FIG. 5C or auxiliary micro-lens array 122-2*fca* in FIG. 6C) as well as the astigmatism compensation function, in a configuration without a dedicated auxiliary micro-deflector array 122-1*a* or auxiliary micro-lens array 122-2*fca*. In such embodiments, micro-stigmators of astigmatism compensator array 122-2*as* may be not grouped, but be driven individually and separately to provide additional dipole fields or lens fields, or both.

Figure 7C:
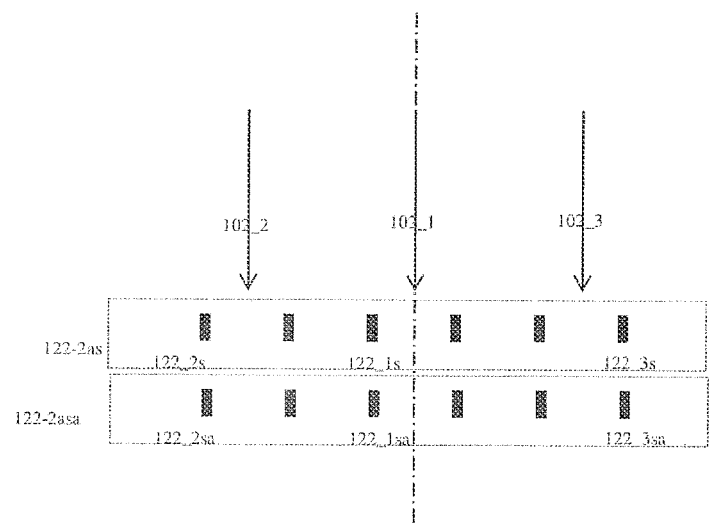
FIG. 7C is a schematic diagram illustrating a portion of an exemplary configuration including an astigmatism compensator array and auxiliary micro-stigmator array, consistent with embodiments of the present disclosure.

FIG. 7C is a schematic diagram illustrating a portion of an exemplary source conversion unit in a multi-beam apparatus with an astigmatism compensator array 122-2*as* and auxiliary micro-stigmator array 122-2*asa*, consistent with embodiments of the present disclosure. Auxiliary micro-stigmator array 122-2*asa* may compensate the inconsistencies of astigmatism compensator array 122-2*as* with respect to astigmatism aberrations. Auxiliary micro-stigmator array 122-2*asa* may comprise an array of micro-stigmators similar to the configuration of astigmatism compensator array 122-2*as*. Each micro-stigmator in astigmatism compensator array 122-2*as* and one corresponding auxiliary micro-stigmator in auxiliary micro-stigmator array 122-2*asa* are aligned with each other such that a pair of micro-stigmators from these two arrays may influence the astigmatism aberration for a corresponding beamlet. A difference of auxiliary micro-stigmator array 122-2*asa* from astigmatism compensator array 122-2*as* is that micro-stigmators in the auxiliary array may not be grouped. The micro-stigmators in the auxiliary array may be driven individually and separately to provide a complete independent controllability over each auxiliary micro-stigmator. While FIG. 7C shows auxiliary micro-stigmator array 122-2*asa* positioned below astigmatism compensator array 122-2*as*, it is appreciated that auxiliary micro-stigmator array 122-2*asa* may be positioned above astigmatism compensator array 122-2*as*.

Figure 8A:
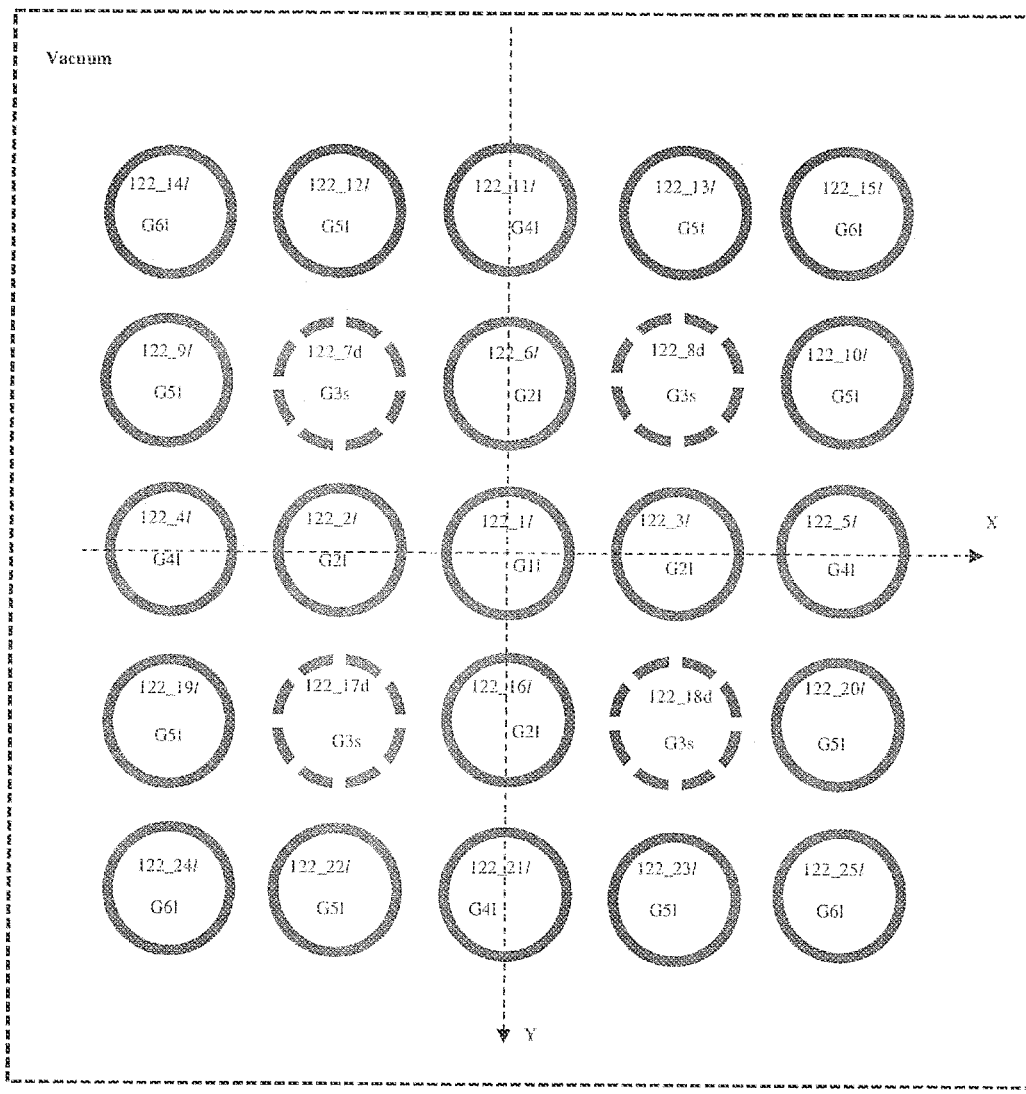
FIG. 8A is a schematic diagram illustrating an exemplary configuration of a field curvature compensator array including a portion of an astigmatism compensator array, consistent with embodiments of the present disclosure.
Figure 8B:
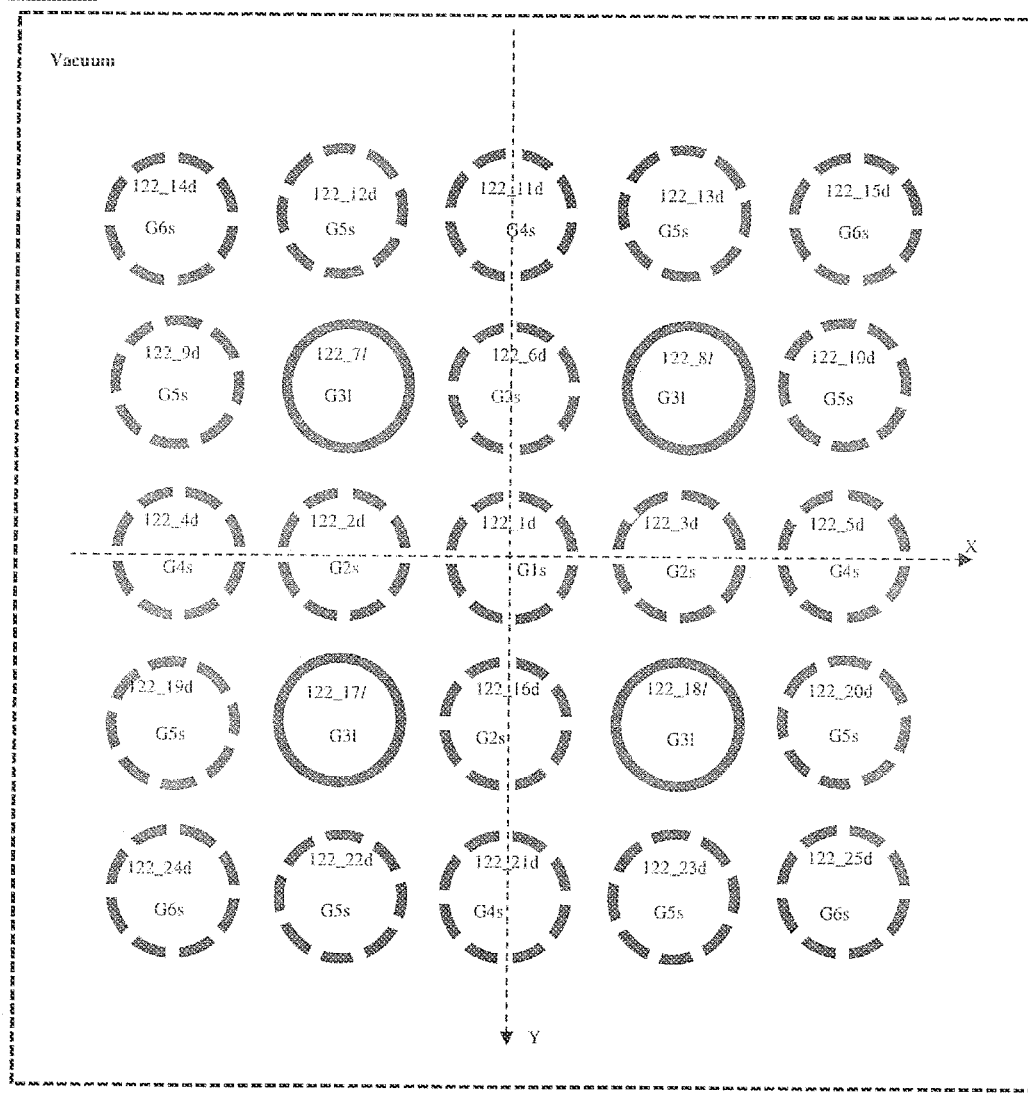
FIG. 8B is a schematic diagram illustrating an exemplary configuration of an astigmatism compensator array including a portion of field curvature compensator array, consistent with embodiments of the present disclosure.

Reference is now made to FIGS. 8A and 8B. To reduce connecting lines or circuit complexity in one array of micro-structures mentioned above, in some embodiments, one or more micro-deflectors of 122-1 in FIG. 5A may be substituted with corresponding micro-lenses of 122-2*fc* in FIG. 6A. Similarly, in some embodiments, one or more micro-stigmators of 122-2*as* in FIG. 7A may be substituted with corresponding micro-lenses of 122-2*fc* in FIG. 6A. In some embodiments, one or more micro-deflectors of 122-1 in FIG. 5A may be substituted with corresponding micro-stigmators of 122-2*as* in FIG. 7A. For example, FIG. 8A shows an exemplary configuration of micro-structure array where four micro-lenses are substituted with micro-stigmators in group G3*s*, and thus the corresponding array becomes 122-2*f*-2*as*. Similarly, FIG. 8B shows an exemplary configuration of micro-structure array where four micro-stigmators are substituted with micro-lenses in group G31, and thus the corresponding array becomes 122-2*as*-21*c*.

Reference is now made to FIG. 9, which is a flow chart illustrating an exemplary method 900 of controlling a plurality of drivers to form a plurality of probe spots, consistent with embodiments of the present disclosure. Method 900 may be performed by an electron beam tool (e.g., electron beam tool 100 of FIG. 2). In particular, a controller (e.g., controller 109 of FIG. 2) of the electron beam tool may perform method 900.

In step 910, a first driver in a first micro-structure array is instructed to control a first set of one or more voltages of a first group of one or more micro-structures to influence a first group of corresponding one or more beamlets. In some embodiments, the first driver is connected to the first group of micro-structures in the first micro-structure array. In step 920, a second driver in the first micro-structure array is instructed to control a second set of one or more voltages of a second group of one or more micro-structures to influence a second group of corresponding one or more beamlets. In some embodiments, the second driver is connected to the second group of micro-structures in the first micro-structure array.

In some embodiments, such as those wherein a source conversion unit includes a second micro-structure array, steps 930 and 940 may be further performed. In step 930, a third driver in a second micro-structure array is instructed to control a third set of one or more voltages of a third group of one or more micro-structures to influence the first group of corresponding one or more beamlets. In step 940, a fourth driver in the second micro-structure array is instructed to control a fourth set of one or more voltages of a fourth group of one or more micro-structures to influence the second group of corresponding one or more beamlets. The micro-structures described herein may be single-pole structure or any type of multi-pole structure, such as a dipole (2-pole) structure, a quadrupole (4-pole) structure, an octupole (8-pole) structure, etc.

In some embodiments, a driver may be positioned outside of a vacuum to avoid outgassing. In such embodiments, a driver may control a group of micro-structures via an interface unit configured to provide connections between the driver and the multi-pole structures.

Figure 10:
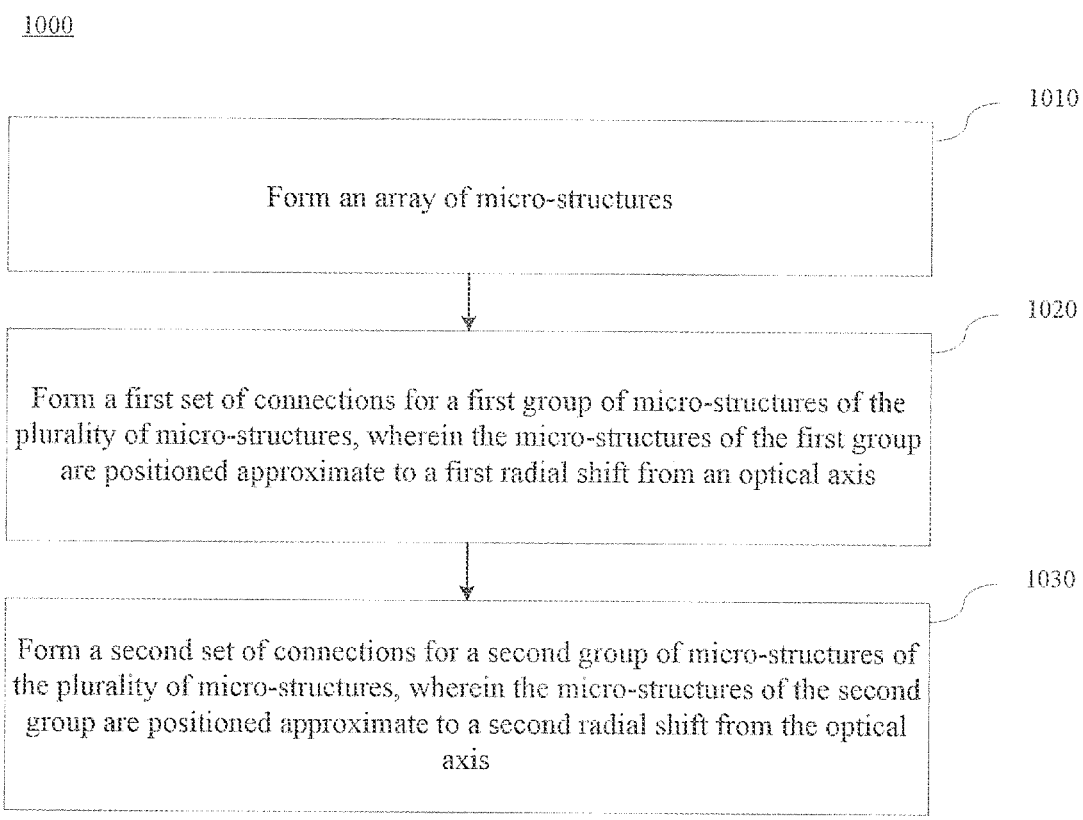
FIG. 10 is a flow chart illustrating an exemplary method for forming a microstructure array, consistent with embodiments of the present disclosure.

Reference is now made to FIG. 10, which is a flow chart illustrating an exemplary method 1000 of manufacturing an exemplary configuration of a micro-structure array, consistent with embodiments of the present disclosure. In some embodiments, the micro-structure array may be manufactured using a semiconductor fabrication process.

In step 1010, an array having a plurality of micro-structures is formed as a base layer. The micro-structure may be a single-pole structure or any type of multi-pole structure, such as a dipole structure, a quadrupole structure, an octupole structure, etc. In step 1020, a connection layer may be formed to create connections for a first group of micro-structures of the plurality of micro-structures. In some embodiments, the micro-structures of the first group are positioned approximate to or substantially at same first radial shifts from a central axis of the array. In step 1030, another connection layer may be formed to create connections for a second group of micro-structures of the plurality of micro-structures. In some embodiments, the micro-structures of the second group are positioned approximate to or substantially at same second radial shifts from the central axis. The connection layers in steps 1020 and 1030 may be connected directly to two different drivers or to an interface connected to the two different drivers.

The embodiments may further be described using the following clauses:

1. A micro-structure array, the array comprising:
a first group of single-pole structures having first radial shifts from a central axis of the array, wherein the first radial shifts are equal or substantially equal, and the first group of single-pole structures comprises corresponding electrodes that are electrically connected and driven by a first driver.

2. The micro-structure array of clause 1, wherein the first driver is configured to enable the first group of single-pole structures to function as micro-lenses to compensate field curvature aberrations of corresponding beam spots in a charged-particle multi-beam apparatus.

3. A micro-structure array, the array comprising:
a first group of multi-pole structures having first radial shifts from a central axis of the array and first orientation angles, wherein the first radial shifts are equal or substantially equal, the first orientation angles of the first group of multi-pole structures are equal or substantially equal, and the first group of multi-pole structures comprises corresponding electrodes that are electrically connected and driven by a first driver.

4. The micro-structure array of clause 3, wherein the first driver is configured to enable the first group of multi-pole structures to function as micro-deflectors to deflect a first group of beamlets in a charged-particle multi-beam apparatus.

5. The micro-structure array of clause 3, wherein the first driver is configured to enable the first group of multi-pole structures to function as micro-stigmators to compensate astigmatism aberrations of a first group of beam spots in a charged-particle multi-beam apparatus.

6. The micro-structure array of any of clauses 4 and 5, further comprising a second group of multi-pole structures having second radial shifts from the central axis and second orientation angles, wherein the second radial shifts are equal or substantially equal, and the second orientation angles of the second group of multi-pole structures are equal or substantially equal, and the second group of multi-pole structures comprises corresponding electrodes that are electrically connected and driven by a second driver.

7. The micro-structure array of clause 6, wherein the second driver is configured to enable the second group of multi-pole structures to function as micro-deflectors to deflect a second group of beamlets in the charged-particle multi-beam apparatus.

8. The micro-structure array of clause 6, wherein the second driver is configured to enable the second group of multi-pole structures to function as micro-stigmators to compensate astigmatism aberrations of a second group of beam spots in the charged-particle multi-beam apparatus.

9. The micro-structure array of any of clauses 4 and 5, further comprising a first group of single-pole structures having second radial shifts from the central axis, wherein the second radial shifts are equal or substantially equal, and the first group of single-pole structures comprises corresponding electrodes that are electrically connected and driven by a second driver.

10. The micro-structure array of clause 9, wherein the second driver is configured to enable the first group of single-pole structures to function as micro-lenses to compensate field curvature aberrations of a second group of beam spots in the charged-particle multi-beam apparatus.

11. A source conversion unit in a charged particle apparatus, comprising:
a first micro-structure array including a first group of multi-pole structures having first radial shifts from an optical axis of the apparatus and first orientation angles, wherein the first radial shifts are equal or substantially equal, the first orientation angles of the first group of multi-pole structures are same or substantially same, and the first group of multi-pole structures comprises corresponding electrodes that are electrically connected and driven by a first driver associated with the first micro-structure array.

12. The source conversion unit of clause 11, wherein the first driver is configured to enable the first group of multi-pole structures to function as micro-deflectors to deflect a first group of beamlets of a charged-particle beam to form a first group of probe spots in the apparatus.

13. The source conversion unit of clause 12, further comprising a second micro-structure array including a first group of single-pole structures being aligned with the first group of multi-pole structures respectively, wherein the first group of single-pole structures comprises corresponding electrodes that are electrically connected and driven by a second driver associated with the second micro-structure array.

14. The source conversion unit of clause 13, wherein the second driver is configured to enable the first group of single-pole structures to function as micro-lenses to influence the first group of beamlets to compensate field curvature aberrations of the first group of probe spots.

15. The source conversion unit of clause 14, further comprising a third micro-structure array including a second group of multi-pole structures being aligned with the first group of multi-pole structures respectively and having second orientation angles, wherein the second orientation angles of the second group of multi-pole structures are same or substantially same, and the second group of multi-pole structures comprises corresponding electrodes that are electrically connected and driven by a third driver associated with the third micro-structure array.

16. The source conversion unit of clause 15, wherein the third driver is configured to enable the second group of multi-pole structures to function as micro-stigmators to influence the first group of beamlets to compensate astigmatism aberrations of the first group of probe spots.

17. The source conversion unit of clause 14, further comprising a third micro-structure array including a second group of multi-pole structures being aligned with the first group of multi-pole structures respectively.

18. The source conversion unit of clause 17, wherein the second group of multi-pole structures are individually controlled to function as at least one of micro-deflectors, micro-stigmators and micro-lenses to further influence the first group of beamlets to affect the first group of probe spots.

19. The source conversion unit of clause 16, further comprising a first micro-structure auxiliary-array including a third group of multi-pole structures being aligned with the first group of multi-pole structures respectively.

20. The source conversion unit of clause 19, wherein the third group of multi-pole structures are individually controlled to function as at least one of micro-defectors, micro-stigmators and micro-lenses to further influence the first group of beamlets to affect the first group of probe spots.

21. The source conversion unit of any of clause 20, further comprising a second micro-structure auxiliary-array including a second group of single-pole structures being aligned with the first group of multi-pole structures respectively.

22. The source conversion unit of clause 21, wherein the second group of single-pole structures are individually controlled to function as micro-lenses to further influence the first group of bearlets to affect the first group of probe spots.

23. A source conversion unit in a charged particle apparatus, comprising:
a first micro-structure array including a first group of multi-pole structures having first radial shifts from an optical axis of the apparatus, and a second group of multi-pole structures having second radial shifts from the optical axis; and
a second micro-structure array including a first group of single-pole structures being aligned with the first group of multi-pole structures respectively, and a third group of multi-pole structures being aligned with the second group of multi-pole structures respectively.

24. The unit of clause 23, wherein the first radial shifts are equal or substantially equal, the first group of multi-pole structures have same or substantially same orientation angles, and corresponding electrodes thereof are electrically connected and driven by a first driver associated with the first micro-structure array.

25. The unit of clause 24, wherein the second radial shifts are equal or substantially equal, the second group of multi-pole structures have same or substantially same orientation angles, and corresponding electrodes thereof are electrically connected and driven by a second driver associated with the first micro-structure array.

26. The unit of clause 25, wherein the corresponding electrodes of the first group of single-pole structures are electrically connected and driven by a third driver associated with the second micro-structure array.

27. The unit of clause 26, wherein the third group of multi-pole structures have same or substantially same orientation angles, and corresponding electrodes thereof are electrically connected and driven by a fourth driver associated with the second micro-structure array.

28. The unit of clause 27, wherein the first driver is configured to enable the first group of multi-pole structures to function as micro-deflectors to deflect a first group of beamlets of a charged particle beam to form a first group of probe spots in the apparatus.

29. The unit of clause 28, wherein the third driver is configured to enable the first group of single-pole structures to function as micro-lenses to influence the first group of beamlets to compensate field curvature aberrations of the first group of probe spots.

30. The unit of clause 29, wherein the fourth driver configured to enable the third group of multi-pole structures to function as micro-deflectors to deflect a second group of beamlets of the charged particle beam to form a second group of probe spots in the apparatus.

31. The unit of clause 30, wherein the second driver is configured to enable the second group of multi-pole structures to function as micro-stigmators to influence the second group of beamlets to compensate astigmatism aberrations of the second group of probe spots.

32. The unit of clause 29, wherein the second driver is configured to enable the second multi-pole structures to function as micro-deflectors to deflect a second group of beamlets of the charged particle beam to form a second group of probe spots in the apparatus.

33. The unit of clause 32, wherein the fourth driver is configured to enable the third multi-pole structures to function as micro-stigmators to influence the second group of beamlets to compensate astigmatism aberrations of the second group of probe spots.

34. A non-transitory computer readable medium including a set of instructions that is executable by one or more processors of a controller to cause the controller to perform a method forming images of a sample, the method comprising:
instructing a first driver, connected to a first group of micro-structures in a first micro-structure array, to control a first set of one or more voltages to influence a first group of beamlets; and
instructing a second driver, connected to a second group of micro-structures in the first array, to control a second set of one or more voltages to influence a second group of beamlets.

35. The computer readable medium of clause 34, wherein the set of instructions that is executable by the one or more processors of the controller to cause the controller to further perform:
instructing a third driver, connected to a first group of micro-structures in a second micro-structure array, to control a third set of one or more voltages to influence the first group of beamlets; and
instructing a fourth driver, connected to a second group of micro-structures in the second array, to control a fourth set of one or more voltages to influence the second group of beamlets.

36. The computer readable medium of clause 34, wherein the set of instructions that is executable by the one or more processors of the controller to cause the controller to further perform:
instructing a plurality of third drivers, connected to a plurality of micro-structures in a second micro-structure array, to influence at least one of the first group of beamlets and the second group of beamlets.

37. A method of manufacturing a micro-structure array including a plurality of micro-structures, the method comprising:

forming the plurality of micro-structures surrounding a central axis of the array;

forming a first set of connections among micro-structures of a first group of the plurality of micro-structures, wherein the micro-structures of the first group are positioned to first radial shifts from the central axis; and forming a second set of connections among micro-structures of a second group of the plurality of micro-structures, wherein the micro-structures of the second group are positioned to have second radial shifts from the central axis.

38. The method of clause 37, further comprising connecting the first set of connections to a first driver.

39. The method of clause 37 or 38, further comprising connecting the second set of connections to a second driver.

40. The method of clause 37, further comprising connecting the first set of connections to a first interface associated with a first driver.

41. The method of clause 37 or 38, further comprising connecting the second set of connections to a second interface associated with a second driver.

42. A method comprising:

using a first driver to control a first group of one or more micro-structures of a first micro-structure array so as to influence a first group of corresponding one or more beamlets; and using a second driver to control a second group of micro-structures of the first micro-structure array so as to influence a second group of corresponding one or more beamlets.

43. The method of clause 42, further comprising:

using a third driver to control a first group of one or more micro-structures of a second micro-structure array so as to influence the first group of corresponding one or more beamlets; and using a fourth driver to control a second group of micro-structures of the second micro-structure array to so as to influence the second group of corresponding one or more beamlets.

44. The method of clause 42, further comprising:

controlling micro-structures of a second micro-structure array to influence at least one of the first group of beamlets and the second group of beamlets.

45. A charged particle beam apparatus, comprising:

a source conversion unit comprising:

a first micro-structure array including a plurality of micro-structures, the first micro-structure array comprising:

a first group of micro-structures of the plurality of micro-structures, wherein micro-structures of the first group have first radial shifts from an optical axis of the apparatus and be driven by a first driver to influence a first group of beamlets of a charged particle beam; and a second group of micro-structures of the plurality of micro-structures, wherein micro-structures of the second group have second radial shifts from the optical axis and be driven by a second driver to influence a second group of beamlets of the charged particle beam.

46. The electron beam apparatus of clause 45, further comprising a movable condenser lens configured to focus the charged particle beam.

47. The electron beam apparatus of clause 45, further comprising an anti-rotation condenser lens to focus the charged particle beam.

48. The electron beam apparatus of clause 45, further comprising a movable anti-rotation condenser lens to focus the charged particle beam.

49. A pole structure array including a plurality of pole structures, the pole structure array comprising:

a first group of pole structures of the plurality of pole structures, wherein the pole structures of the first group are configured to be driven by a first driver and are positioned approximate to a first radial shift from an optical axis; and a second group of pole structures of the plurality of pole structures, wherein the pole structures of the second group are configured to be driven by a second driver and are positioned approximate to a second radial shift from the optical axis.

50. The pole structure array of clause 49, wherein the plurality of pole structures have corresponding symmetry axes and that the plurality of pole structures are rotated such that the corresponding symmetry axes are substantially parallel to corresponding radial directions from the optical axis.

51. A source conversion unit, comprising:

a first pole structure array including a plurality of pole structures, the first pole structure array comprising:

a first group of pole structures of the plurality of pole structures, wherein pole structures of the first group are configured to be driven by a first driver and are positioned approximate to a first radial shift from an optical axis; and a second group of pole structures of the plurality of pole structures, wherein pole structures of the second group are configured to be driven by a second driver and are positioned approximate to a second radial shift from the optical axis.

52. The micro-structure array of clause 3, wherein a first micro-pole structure of the first group is configured to form a virtual image of an electron source.

53. The micro-structure array of clause 3, wherein each micro-pole structure of be first group is configured to form a virtual image of an electron source.

54. The micro-structure array of clause 3, wherein each micro-pole structure of the first group is configured to form a different virtual image of a same single electron source.

55. The micro-structure array of clause 3, wherein a First micro-pole structure of the first group is configured to generate an electric field that is substantially perpendicular to a central axis of the first micro-pole structure.

56. The micro-structure array of clause 3, wherein each micro-pole structure of the first group has a central axis that is substantially parallel to a central axis of each other micro-pole structure of the first group, and wherein said each micro-pole structure of the first group is configured to generate an electric field that is substantially perpendicular to the central axis.

It is appreciated that a controller of the multi-beam apparatus could use software to control the functionality described above. For example, the controller may send instructions to the aforementioned lenses to generate an appropriate field (e.g., magnetic or electrostatic field), respectively. The controller may also send instructions to drivers to adjust voltages to control the aforementioned arrays. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Although the disclosed embodiments have been explained in relation to its preferred embodiments, it is to be understood that other modifications and variation can be made without departing the spirit and scope of the subject matter as hereafter claimed.

What is claimed is:

1. A pole structure array including a plurality of pole structures arranged around an optical axis, the pole structure array comprising: a first group of pole structures of the plurality of pole structures, wherein the pole structures of the first group are configured to be driven by a first driver and are positioned approximate to a first radial shift from the optical axis; and a second group of pole structures of the plurality of pole structures, wherein the pole structures of the second group are configured to be driven by a second driver and are positioned approximate to a second radial shift from the optical axis.

2. The pole structure array of claim 1, wherein the first driver is configured to enable the pole structures of the first group to function as micro-deflectors to deflect a first group of beamlets in a charged-particle multi-beam apparatus.

3. The pole structure array of claim 1, wherein the second driver is configured to enable the pole structures of the second group to function as micro-deflectors to deflect a second group of beamlets in a charged-particle multi-beam apparatus.

4. The pole structure array of claim 1, wherein the first driver is configured to enable the pole structures of the first group to function as micro-stigmators to compensate astigmatism aberrations of a first group of beam spots in a charged-particle multi-beam apparatus.

5. The pole structure array of claim 1, wherein the second driver is configured to enable the pole structures of the second group to function as micro-stigmators to compensate astigmatism aberrations of a second group of beam spots in a charged-particle multi-beam apparatus.

6. The pole structure array of claim 1, wherein the pole structures of the first group are single-pole structures.

7. The pole structure array of claim 6, wherein the first driver is configured to enable the pole structures of the first group to function as micro-lenses to compensate field curvature aberrations of a first group of beam spots in a charged-particle multi-beam apparatus.

8. The pole structure array of claim 1, wherein the plurality of pole structures have corresponding symmetry planes and the plurality of pole structures are rotated such that the corresponding symmetry planes are substantially parallel to corresponding radial directions from the optical axis.

9. The pole structure array of claim 8, wherein each of the plurality of pole structures is bisected into symmetrical two parts by each of the corresponding symmetry planes.

10. A source conversion unit, comprising: a first pole structure array including a plurality of pole structures arranged around an optical axis, the first pole structure array comprising: a first group of pole structures of the plurality of pole structures, wherein the pole structures of the first group are configured to be driven by a first driver and are positioned approximate to a first radial shift from the optical axis; and a second group of pole structures of the plurality of pole structures, wherein the pole structures of the second group are configured to be driven by a second driver and are positioned approximate to a second radial shift from the optical axis.

11. The source conversion unit of claim 10, wherein the first driver is configured to enable the pole structures of the first group to function as micro-deflectors to deflect a first group of beamlets in a charged-particle multi-beam apparatus.

12. The source conversion unit of claim 10, wherein the second driver is configured to enable the pole structures of the second group to function as micro-deflectors to deflect a second group of beamlets in a charged-particle multi-beam apparatus.

13. The source conversion unit of claim 10, wherein the first driver is configured to enable the pole structures of the first group to function as micro-stigmators to compensate astigmatism aberrations of a first group of beam spots in a charged-particle multi-beam apparatus.

14. The source conversion unit of claim 10, wherein the second driver is configured to enable the pole structures of the second group to function as micro-stigmators to compensate astigmatism aberrations of a second group of beam spots in a charged-particle multi-beam apparatus.

15. The source conversion unit of claim 10, wherein the pole structures of the first group are single-pole structures.

16. The source conversion unit of claim 15, wherein the first driver is configured to enable the pole structures of the first group to function as micro-lenses to compensate field curvature aberrations of a first group of beam spots in a charged-particle multi-beam apparatus.

17. The source conversion unit of claim 10, wherein the plurality of pole structures have corresponding symmetry planes and the plurality of pole structures are rotated such that the corresponding symmetry planes are substantially parallel to corresponding radial directions from the optical axis.

18. The source conversion unit of claim 17, wherein each of the plurality of pole structures is bisected into symmetrical two parts by each of the corresponding symmetry planes.

* * * * *